(12) United States Patent
Hautala et al.

(10) Patent No.: US 8,048,788 B2
(45) Date of Patent: Nov. 1, 2011

(54) METHOD FOR TREATING NON-PLANAR STRUCTURES USING GAS CLUSTER ION BEAM PROCESSING

(75) Inventors: John J. Hautala, Beverly, MA (US); Noel Russell, Waterford, NY (US)

(73) Assignee: TEL Epion Inc., Billerica, MA (US)

(*) Notice: Subject to any disclaimer, the term of this patent is extended or adjusted under 35 U.S.C. 154(b) by 0 days.

(21) Appl. No.: 12/575,887

(22) Filed: Oct. 8, 2009

(65) Prior Publication Data

US 2011/0084216 A1    Apr. 14, 2011

(51) Int. Cl.
*H01L 21/425*    (2006.01)
(52) U.S. Cl. ........................................ 438/514; 438/515
(58) Field of Classification Search .................. None
See application file for complete search history.

(56) References Cited

U.S. PATENT DOCUMENTS

| | | | |
|---|---|---|---|
| 4,361,762 A | 11/1982 | Douglas | |
| 4,564,533 A | 1/1986 | Yamazaki | |
| 4,740,267 A | 4/1988 | Knauer et al. | |
| 4,886,971 A | 12/1989 | Matsumura et al. | |
| 4,916,311 A | 4/1990 | Fuzishita et al. | |
| 5,094,879 A | 3/1992 | Matsuda et al. | |
| 6,218,207 B1 | 4/2001 | Itoh et al. | |
| 6,797,339 B2 | 9/2004 | Akizuki et al. | |
| 7,060,989 B2 | 6/2006 | Swenson et al. | |
| 7,173,252 B2 | 2/2007 | Mack | |
| 7,259,036 B2 | 8/2007 | Borland et al. | |
| 2002/0130275 A1 | 9/2002 | Mack et al. | |
| 2006/0043317 A1 | 3/2006 | Ono et al. | |
| 2006/0093753 A1 | 5/2006 | Nickel | |
| 2006/0105570 A1 | 5/2006 | Hautala et al. | |
| 2006/0124934 A1 | 6/2006 | Fukumiya et al. | |
| 2007/0087034 A1 | 4/2007 | Blinn et al. | |
| 2007/0210366 A1 | 9/2007 | Sandhu et al. | |
| 2007/0224824 A1* | 9/2007 | Chen et al. ................... | 438/700 |
| 2008/0149826 A1 | 6/2008 | Renau et al. | |
| 2009/0152629 A1 | 6/2009 | Hu et al. | |
| 2009/0263751 A1* | 10/2009 | Sivakumar et al. ........... | 430/323 |

FOREIGN PATENT DOCUMENTS

| | | |
|---|---|---|
| FR | 2850400 A1 | 7/2004 |
| JP | 62296357 A | 12/1987 |
| JP | 08316231 | 11/1996 |
| JP | 2009 176886 A * | 8/2009 |

(Continued)

OTHER PUBLICATIONS

Isao Yamada et al., "Materials Processing by Gas Cluster Ion Beams", Materials Science and Engineering Reports, vol. 34, Issue 6, pp. 231-295, Oct. 30, 2001 (ISSN 09S7-796X).

(Continued)

*Primary Examiner* — Scott B Geyer
(74) *Attorney, Agent, or Firm* — Wood, Herron & Evans, LLP

(57) ABSTRACT

A method for treating a structure is described. One embodiment includes forming a structure on a substrate, wherein the structure has a plurality of surfaces including one or more first surfaces lying substantially parallel to a first plane parallel with said substrate and one or more second surfaces lying substantially perpendicular to the first plane. Additionally, the method comprises directing a gas cluster ion beam (GCIB) formed from a material source toward the substrate with a direction of incidence, and orienting the substrate relative to the direction of incidence. The method further comprises treating the one or more second surfaces.

19 Claims, 8 Drawing Sheets

FOREIGN PATENT DOCUMENTS

WO  2009045740 A2  4/2009

OTHER PUBLICATIONS

Saitoh, Y. et al., Acceleration of cluster and molecular ions by TIARA 3 MV tandem accelerator, vol. 452, No. 1-2, Sep. 21, 2000, pp. 61-66, XP004210610, ISSN: 0168-9002.

Yamada, I. et al, Surface modification with gas cluster ion beams, Nuclear Instruments & Methods in Physics Research, vol. B79, Nov. 2, 1992, pp. 223-226, XP001031961, ISSN: 0168-583X.

Hautala, J., et al., "Infusion Processing: An Alternative to Plasma Technology for Semiconductor Device Manufacturing", Proceedings of the Electrochemical Society, Symposium on ULSI Process Integration IV (Quebec PR, Canada, May 16-20, 2005), 2005, vol. 6, pp. 118-130.

Shao et al., "Nitrogen gas-cluster ion beam—A new nitrogen source for GaN growth", Mat. Res. Soc. Symp. Proc., 2003, vol. 743, pp. 97-102.

Akizuki, M. et al., $SiO_2$ Film Formation at Room Temperature by Gas Cluster Ion Beam Oxidation, Nuclear Instruments and Methods in Physics Research B 112 (1996) 83-85.

Borland et al., Doping and Deposition, Solid State Technology, May 2004, pp. 114-117.

* cited by examiner

METHOD FOR TREATING NON-PLANAR STRUCTURES USING GAS CLUSTER ION BEAM PROCESSING

CROSS-REFERENCE TO RELATED APPLICATIONS

This application is related to co-pending U.S. patent application Ser. No. 12/575,806, entitled GAS CLUSTER ION BEAM PROCESSING METHOD FOR PREPARING AN ISOLATION LAYER IN NON-PLANAR GATE STRUCTURES, filed on even date herewith, and co-pending U.S. patent application Ser. No. 12/575,931, entitled METHOD AND SYSTEM FOR TILTING A SUBSTRATE DURING GAS CLUSTER ION BEAM PROCESSING, filed on even date herewith. The entire contents of these applications are herein incorporated by reference in their entirety.

BACKGROUND OF THE INVENTION

1. Field of Invention

The invention relates to a method for treating non-planar structures using a gas cluster ion beam (GCIB). In particular, the invention relates to a method for treating non-planar gate structures using a GCIB.

2. Description of Related Art

Gas-cluster ion beams (GCIB's) are used for etching, cleaning, smoothing, and forming thin films. For purposes of this discussion, gas clusters are nano-sized aggregates of materials that are gaseous under conditions of standard temperature and pressure. Such gas clusters may consist of aggregates including a few to several thousand molecules, or more, that are loosely bound together. The gas clusters can be ionized by electron bombardment, which permits the gas clusters to be formed into directed beams of controllable energy. Such cluster ions each typically carry positive charges given by the product of the magnitude of the electron charge and an integer greater than or equal to one that represents the charge state of the cluster ion.

The larger sized cluster ions are often the most useful because of their ability to carry substantial energy per cluster ion, while yet having only modest energy per individual molecule. The ion clusters disintegrate on impact with the substrate. Each individual molecule in a particular disintegrated ion cluster carries only a small fraction of the total cluster energy. Consequently, the impact effects of large ion clusters are substantial, but are limited to a very shallow surface region. This makes gas cluster ions effective for a variety of surface modification processes, but without the tendency to produce deeper sub-surface damage that is characteristic of conventional ion beam processing.

Conventional cluster ion sources produce cluster ions having a wide size distribution scaling with the number of molecules in each cluster that may reach several thousand molecules. Clusters of atoms can be formed by the condensation of individual gas atoms (or molecules) during the adiabatic expansion of high pressure gas from a nozzle into a vacuum. A skimmer with a small aperture strips divergent streams from the core of this expanding gas flow to produce a collimated beam of clusters. Neutral clusters of various sizes are produced and held together by weak inter-atomic forces known as Van der Waals forces. This method has been used to produce beams of clusters from a variety of gases, such as helium, neon, argon, krypton, xenon, nitrogen, oxygen, carbon dioxide, sulfur hexafluoride, nitric oxide, and nitrous oxide, and mixtures of these gases.

Several emerging applications for GCIB processing of substrates on an industrial scale are in the semiconductor field. Although GCIB processing of a substrate is performed in a wide variety of processes, many processes fail to provide adequate control of critical properties and/or dimensions of the surface, structure, and/or film subject to GCIB treatment.

SUMMARY OF THE INVENTION

The invention relates to a method for treating non-planar structures using a gas cluster ion beam (GCIB). In particular, the invention relates to a method for treating non-planar gate structures using a GCIB.

Further, the invention relates to treating a sidewall of a fin using a GCIB. As an example, one or more GCIB treatment processes may be utilized to form a screening layer on a top surface of the fin and/or dope a sidewall of the fin. As another example, the fin may be utilized as a source or drain in a non-planar or three-dimensional (3D) gate structure.

According to one embodiment, a method for treating a structure is described. The method comprises forming a structure on a substrate, wherein the structure has a plurality of surfaces including one or more first surfaces lying substantially parallel to a first plane parallel with said substrate and one or more second surfaces lying substantially perpendicular to the first plane. Additionally, the method comprises directing a GCIB formed from a material source toward the substrate with a direction of incidence, and orienting the substrate relative to the direction of incidence. The method further comprises treating the one or more second surfaces.

According to another embodiment, a method for preparing a gate structure is described. The method comprises forming a fin on a substrate and introducing a dopant into a sidewall of the fin using a GCIB.

According to yet another embodiment, a method for preparing a gate structure is described. The method comprises forming a fin on a substrate forming a screening layer on a top surface of the fin using a GCIB, and thereafter introducing a dopant into a sidewall of the fin.

DETAILED DESCRIPTION OF SEVERAL EMBODIMENTS

Figure 1:
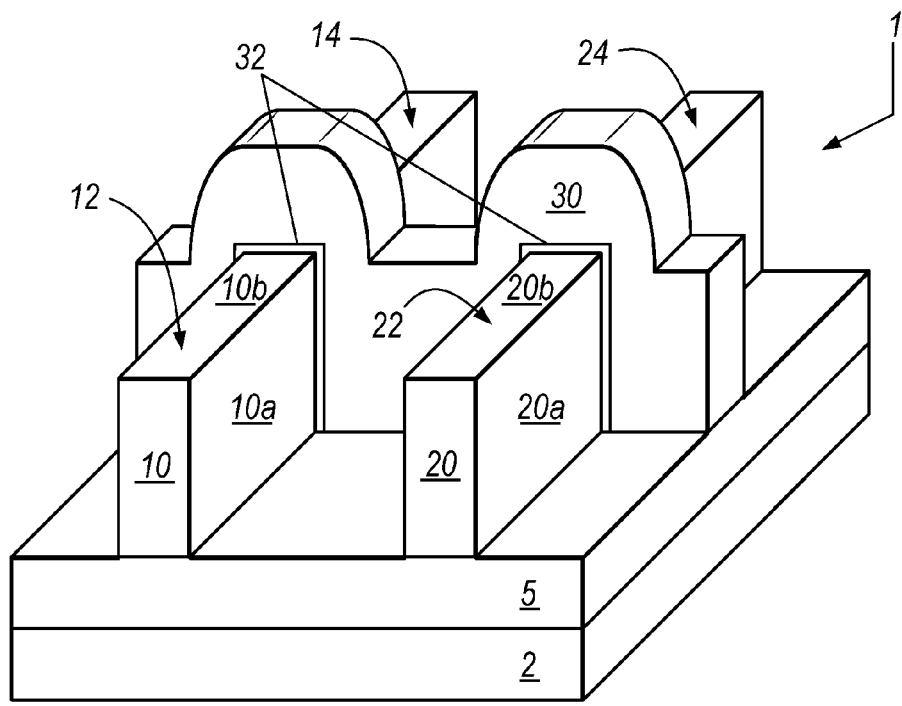
FIG. 1 is a schematic oblique view of a three-dimensional (3D) structure.

A method and system for treating a structure on a substrate using a gas cluster ion beam (GCIB) are disclosed in various embodiments. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but does not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

As described above, in material processing such as semiconductor material processing, there is a general need for treating various surfaces of a substrate, including doping these surfaces, modifying the material properties of these surfaces, forming thin films of material on these surfaces, etching these surfaces, to name a few, using one or more GCIB treatments. In particular, there is a need to perform such treatments of these surfaces of the substrate, while providing adequate control of critical properties and/or dimensions of the surface, structure, and/or film subject to the one or more GCIB treatments.

Furthermore, as described above, there is a need for selectively growing, depositing, etching, modifying, and/or doping material on only chosen surfaces of a substrate using a GCIB. By adjusting properties of the GCIB and/or adjusting the orientation of the substrate relative to the GCIB, the treatment of the substrate may proceed at different rates on select surfaces. For example, treatment may proceed on some surfaces, while they are substantially avoided or reduced on other surfaces.

"Substrate" as used herein generically refers to the object being processed in accordance with the invention. The substrate may include any material portion or structure of a device, particularly a semiconductor or other electronics device, and may, for example, be a base substrate structure, such as a semiconductor wafer or a layer on or overlying a base substrate structure such as a thin film. Thus, substrate is not intended to be limited to any particular base structure, underlying layer or overlying layer, patterned or unpatterned, but rather, is contemplated to include any such layer or base structure, and any combination of layers and/or base structures. The description below may reference particular types of substrates, but this is for illustrative purposes only and not limitation.

Herein, the term "to form" (or "forming", or "formation") is used to broadly represent the preparation of a thin film of material on one or more surfaces of a substrate. Additionally herein, "growth" and "deposition" are defined and used in a manner to distinguish from one another. During growth, a thin film is formed on a substrate, wherein only a fraction of the atomic constituents of the thin film are introduced in the GCIB and the remaining fraction is provided by the substrate upon which the thin film is grown. For example, when growing SiOx on a substrate, the substrate may comprise a silicon surface, which is irradiated by a GCIB containing oxygen. The grown layer is thus a reaction product of the silicon from the silicon surface and the oxygen from the GCIB. To the contrary, during deposition, a thin film is formed on a substrate, wherein substantially all of the atomic constituents of the thin film are introduced in the GCIB. For example, when depositing SiCx, the substrate is irradiated by a GCIB containing both silicon and carbon.

Referring now to FIG. 1, a perspective view of a 3D structure is provided. The 3D structure may comprise a 3D gate structure 1, such as a fin FET (field-effect transistor) or multi-gate fin FET. For example, the 3D gate structure 1 illustrated in FIG. 1 includes a dual-gate fin FET. The 3D gate structure 1 comprises a first fin 10 having a first source region 12 and a first drain region 14, and a second fin 20 having a second source region 22 and a second drain region 24. The first fin 10 and the second fin 20 are formed on an insulation layer 5 above substrate 2. The 3D gate structure 1 further comprises a gate 30, and a gate insulation layer 32 disposed between the gate 30 and the first fin 10 and the second fin 20.

When preparing the first and second source regions 12 and 22, and the first and second drain regions 14 and 24, the side walls 10a, 20a of the first fin 10 and the second fin 20 are doped. To avoid or reduce the introduction of dopant to the top surfaces 10b, 20b of the first and second fins 10 and 20, a screening layer (not shown) is formed on the top surfaces 10b, 20b of the first and second fins 10 and 20 to protect the top surfaces 10b, 20b when introducing the dopant into the sidewalls 10a, 20a. Therefore, during fabrication of a 3D structure, manufacturing techniques are sought that form material on and/or introduce material to only select surfaces of the 3D structure.

Figure 2:
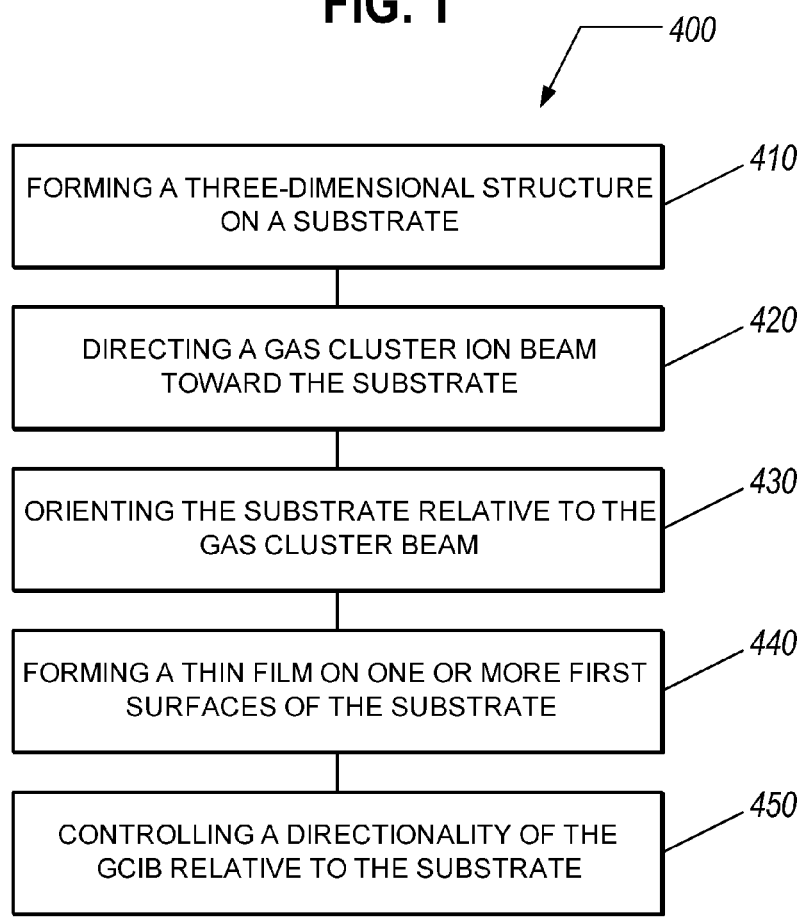
FIG. 2 is a flow chart illustrating a method of forming material on a structure according to an embodiment.
Figure 3A:
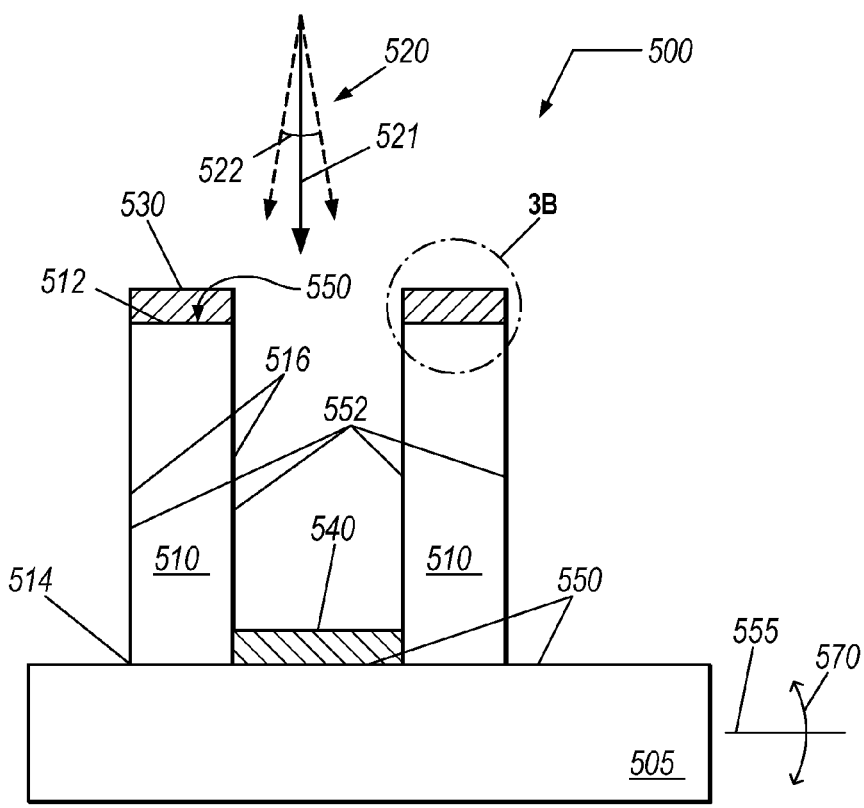
FIG. 3A provides a schematic cross-sectional view of a structure according to an embodiment.
Figure 3B:
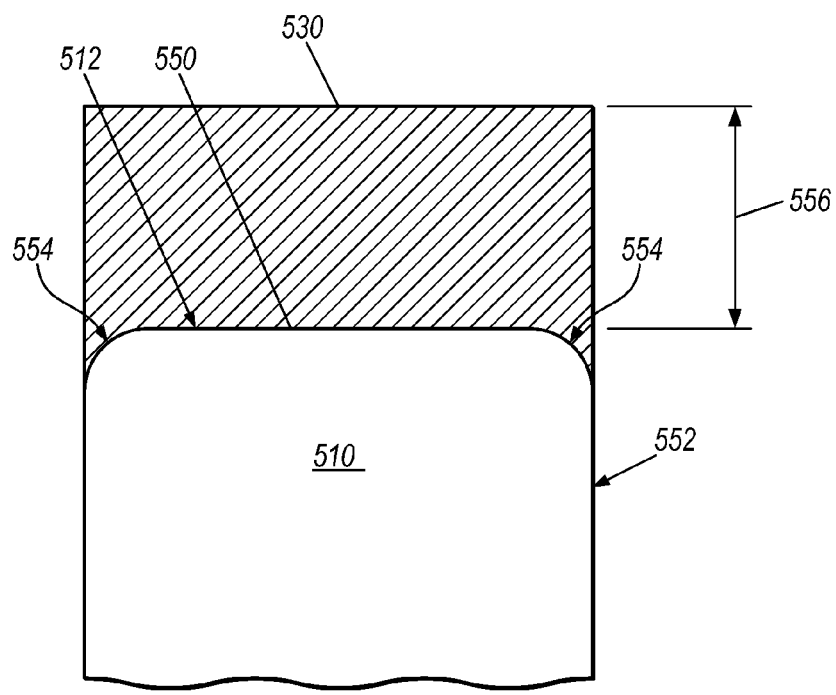
FIG. 3B provides an enlarged view of the encircled portion 3B of the structure depicted in FIG. 3A.

Referring now to FIGS. 2, 3A, and 3B, a method for forming material on a structure is described according to an embodiment. The method is illustrated by a flow chart 400 beginning in 410 with forming a structure on a substrate, wherein the structure has a plurality of surfaces including one or more first surfaces lying substantially parallel to a first plane parallel with the substrate, and one or more second surfaces lying substantially perpendicular to said first plane. The substrate can include a conductive material, a non-conductive material, or a semi-conductive material, or a combination of two or more materials thereof. Additionally, the substrate may include one or more material structures formed thereon, or the substrate may be a blanket substrate free of material structures. For example, the structure may comprise a multi-gate field-effect transistor (MuFET), or a fin field-effect transistor (FinFET). Additionally, for example, the structure may comprise a via, a contact, a trench, a film stack, etc.

As shown in FIGS. 3A and 3B, a schematic cross-sectional view of a structure 500 is illustrated according to an embodiment. The structure 500 comprises one or more fins 510, each having a base 514 at a base surface of a substrate 505, a top surface 512, two sidewalls 516 (that may be substantially parallel with one another) extending between the base 514 and the top surface 512, and at least one end wall (not shown) extending between the base 514 and the top surface 516 and extending between the two sidewalls 516. At least one of the first surfaces 550, which include the top surface 512 of each fin 510 and the base surface at the substrate 505, is oriented substantially parallel with a first plane 555 (i.e., the plane within which substrate 505 lies). As shown in FIG. 3A, the first plane 555 may be substantially perpendicular to a GCIB 520. In one embodiment, each of the first surfaces 550 is oriented substantially parallel with the first plane 555. Further, at least one of the second surfaces 552, which include sidewalls 516, is oriented substantially perpendicular with the first plane 555. In one embodiment, each of the second surfaces 552 is oriented substantially perpendicular with the first plane 555.

As an example, one or more second surfaces 552 that are substantially perpendicular to the first plane 555 may comprise an angular deviation of up to about 25 degrees from a surface normal of the first plane 555. Alternatively, one or more second surfaces 552 that are substantially perpendicular to the first plane 555 may comprise an angular deviation of up to about 20 degrees from a surface normal of the first plane 555. Alternatively, one or more second surfaces 552 that are substantially perpendicular to the first plane 555 may comprise an angular deviation of up to about 10 degrees from a surface normal of the first plane 555. Alternatively yet, one or more second surfaces 552 that are substantially perpendicular to the first plane 555 may comprise an angular deviation of up to about 5 degrees from a surface normal of the first plane 555.

Consequently, one or more first surfaces 550 that are substantially parallel with the first plane 555 may comprise an angular deviation greater than about 75 degrees from a surface normal of the first plane 555. Alternatively, one or more first surfaces 550 that are substantially parallel with the first plane 555 may comprise an angular deviation greater than about 80 degrees from a surface normal of the first plane 555. Alternatively, one or more first surfaces 550 that are substantially parallel with the first plane 555 may comprise an angular deviation greater than about 85 degrees from a surface normal of the first plane 555. Alternatively yet, one or more first surfaces 550 that are substantially parallel with the first plane 555 may comprise an angular deviation greater than about 90 degrees from a surface normal of the first plane 555.

Referring again to FIG. 2, in 420, a GCIB formed from a material source for a thin film is directed toward the substrate with a direction of incidence relative to the substrate. The deviation of the direction of incidence of the GCIB may vary plus or minus about 1 to 3 degrees due to variations in the GCIB processing equipment. The GCIB processing system can be any of the GCIB processing systems (100, 100' or 100") described in FIG. 7, 8 or 9 (described below), or any combination thereof.

The substrate can be disposed in a GCIB processing system. The substrate can be positioned on a substrate holder and may be securely held by the substrate holder, wherein the substrate holder locates the substrate relative to the GCIB. The temperature of the substrate may or may not be controlled. For example, the substrate may be heated or cooled during a film forming process. The environment surrounding the substrate is maintained at a reduced pressure.

In 430, the substrate is oriented relative to the direction of incidence. For example, as shown in FIG. 3A, GCIB 520 is directed at substrate 505 along a direction of incidence 521 substantially normal to substrate 505 (or substantially normal to the first plane 555). Therein, the orientation of substrate 505 relative to the direction of incidence 521 of GCIB 520 may be varied by adjusting an inclination angle 570 of substrate 505 relative to GCIB 520.

In 440, a thin film is formed on one or more of the first surfaces, wherein the formation of the thin film comprises constituents from the material source and constituents from the substrate (i.e., the thin film is grown), or constituents entirely from the material source (i.e., the thin film is deposited). As shown in FIG. 3A, a thin film 530 is formed on at least one first surface 550, specifically the top surfaces 512 of fins 510. The thin film 530 may serve as a screening layer when doping sidewalls 516 of fins 510. The screening layer may absorb or trap dopant to avoid over-dosing the top surface 512 of the fin 510. Additionally, as shown in FIG. 3A, an optional thin film 540 is formed on another first surface 550, specifically the base surface adjacent base 514 of fins 510. The optional thin film 540 may serve as an isolation layer between neighboring fins 510, as shown.

The formation of the thin film in 440 utilizing the GCIB may comprise selecting a beam energy (or beam acceleration potential), a beam energy distribution, a beam focus, and a beam dose to achieve a desired thickness of the thin film on the first surfaces. Additionally, the formation of the GCIB may comprise accelerating the GCIB to achieve the beam energy, focusing the GCIB to achieve the beam focus, irradiating the accelerated GCIB onto at least a portion of the substrate according to the beam dose, and forming the thin film on that irradiated portion of the substrate to achieve the thickness.

Herein, beam dose is given the units of number of clusters per unit area. However, beam dose may also include beam current and/or time (e.g., GCIB dwell time). For example, the beam current may be measured and maintained constant, while time is varied to change the beam dose. Alternatively, for example, the rate at which clusters strike the surface of the substrate per unit area (i.e., number of clusters per unit area per unit time) may be held constant while the time is varied to change the beam dose.

Additionally, other GCIB properties may be varied to adjust the film thickness, and other film properties such as the surface roughness, including, but not limited to, gas flow rate, stagnation pressure, cluster size, or gas nozzle design (such as nozzle throat diameter, nozzle length, and/or nozzle divergent section half-angle). Furthermore, other film properties may be varied by adjusting the GCIB properties including, but not limited to, film density, film quality, etc.

By way of example, the beam energy may range up to 100 keV, and the beam dose may range up to about $1 \times 10^{16}$ clusters per $cm^2$. Alternatively, the beam energy may range up to 50 keV, and the beam dose may range up to about $1 \times 10^{16}$ clusters per $cm^2$. Alternatively, the beam energy may range up to 25 keV, and the beam dose may range up to about $1 \times 10^{16}$ clusters per $cm^2$. Alternatively, the beam energy may range up to 10 keV, and the beam dose may range up to about $1 \times 10^{16}$ clusters per $cm^2$. Alternatively, the beam energy may range up to 5 kV, and the beam dose may range up to about $1 \times 10^{16}$ clusters per $cm^2$. Alternatively, the beam energy may range up to 5 keV, and the beam dose may range up to about $8 \times 10^{13}$ clusters per $cm^2$. Alternatively, the beam energy may range up to 4 keV, and the beam dose may range up to about $1 \times 1014$ clusters per $cm^2$. Alternatively, the beam energy may range up to 3 keV, and the beam dose may range up to about $2 \times 10^{14}$ clusters per $cm^2$. Alternatively yet, the beam energy may range up to 2 keV, and the beam dose may range up to about $1 \times 10^{15}$ clusters per $cm^2$.

By way of yet another example, the GCIB may be established for an energy per cluster atom (i.e., eV/cluster atom)

ranging from about 0.5 eV/cluster atom to about 10 eV/cluster atom. Alternatively, the energy per cluster atom may range from about 1 eV/cluster atom to about 10 eV/cluster atom. Alternatively, the energy per cluster atom may range from about 0.5 eV/cluster atom to about 1 eV/cluster atom. For instance, the ratio, energy per cluster atom, may be varied by varying the total pressure at the inlet of the nozzle in the GCIB processing system to adjust the cluster size (e.g., number of atoms per cluster), or varying the beam acceleration potential to adjust the beam energy, or both.

As shown in FIG. 3B, the thin film 530 of thickness 556 is formed on the first surface 550, specifically the top surface 512 of fin 510, and is formed in part on one or more third surfaces 554, for example, the surfaces that form the transition between a first surface 550 and a second surface 552. The formation of thin film 530 on the second surfaces 552 may be substantially avoided as shown in FIG. 3A. The thickness 556 may range up to about 500 nm (nanometers). Alternatively, the thickness 556 may range up to about 200 nm. Alternatively, the thickness 556 may range up to about 100 nm. Alternatively, the thickness 556 may range up to about 50 nm. Alternatively, the thickness 556 may range up to about 25 nm. Alternatively yet, the thickness 556 may range from about 4 nm to about 25 nm.

In one example, when growing the thin film, as the gas clusters collide with the irradiated first surfaces, material is infused in the surface layer of the substrate or the underlying layer formed on substrate, and this material becomes interspersed with the substrate material. As the GCIB dose is increased, the thickness of the grown thin film may be increased until for a given GCIB energy (or GCIB acceleration potential) the film thickness saturates. As the GCIB energy is increased, the thickness of the grown thin film may be increased.

In another example, when depositing the thin film, as the gas clusters collide with the irradiated first surfaces, material is infused within a sublayer of the irradiated surface of the substrate at low GCIB dose, and eventually transitions to a purely deposition process at a higher GCIB dose. The infusion of material within the sublayer forms a mixed layer, which acts as a graded interface between the underlying substrate composition and the thin film subsequently deposited on the substrate. As the GCIB dose is increased, the thickness of the deposited thin film may be increased. Additionally, as the GCIB energy is increased, the thickness of the deposited thin film may be increased.

The forming of the thin film may comprise growing and/or depositing silicon oxide ($SiO_x$), silicon nitride ($SiN_y$), or silicon oxynitride ($SiO_xN_y$), wherein the material source comprises one or more silicon-containing precursors, one or more oxygen-containing precursors, and/or one or more nitrogen-containing precursors, or any combination of two or more thereof, and an optional inert gas.

Additionally, the forming of the thin film may include growing and/or depositing a $SiC_x$, $SiO_xC_y$, or $SiC_xN_y$ film on a substrate or layer on a substrate. Additionally yet, the forming of the thin film may include growing a germanide. According to embodiments of the invention, the material source may thus comprise an oxygen-containing gas, a nitrogen-containing gas, a carbon-containing gas, a hydrogen-containing gas, a silicon-containing gas, or a germanium-containing gas, or a combination of two or more thereof.

When growing an oxide such as $SiO_x$, a substrate comprising silicon or a silicon-containing material may be irradiated by a GCIB formed from a material source having an oxygen-containing gas. For example, the material source may comprise $O_2$. In another example, the material source may comprise $O_2$, NO, $NO_2$, $N_2O$, CO, or $CO_2$, or any combination of two or more thereof.

When growing a nitride such as $SiN_x$, a substrate comprising silicon or a silicon-containing material may be irradiated by a GCIB formed from a material source having a nitrogen-containing gas. For example, the material source may comprise $N_2$. In another example, the material source may comprise $N_2$, NO, $NO_2$, $N_2O$, or $NH_3$, or any combination of two or more thereof.

When growing a carbide such as $SiC_x$, a substrate comprising silicon or a silicon-containing material, may be irradiated by a GCIB formed from a material source having a carbon-containing gas. For example, the material source may comprise $CH_4$. In another example, the material source may comprise $CH_4$ (or more generally a hydrocarbon gas, i.e., $C_xH_y$), CO, or $CO_2$, or any combination of two or more thereof.

When growing an oxynitride such as $SiO_xN_y$, a substrate comprising silicon or a silicon-containing material may be irradiated by a GCIB formed from a material source having an oxygen-containing gas and a nitrogen-containing gas. For example, the material source may comprise $O_2$ and $N_2$, NO, $NO_2$, or $N_2O$, or any combination of two or more thereof.

When growing a carbonitride such as $SiC_xN_y$, a substrate comprising silicon or a silicon-containing material may be irradiated by a GCIB formed from a material source mixture having a carbon-containing gas and a nitrogen-containing gas. For example, the material source may comprise $CH_4$ and $N_2$.

When growing a germanide such as SiGe, a substrate comprising silicon or a silicon-containing material may be irradiated by a GCIB formed from a material source having a germanium-containing gas. For example, the material source may comprise $GeH_4$ or $Ge_2H_6$, or both.

Exemplary data for growing a thin film using a GCIB is provided in pending U.S. patent application Ser. No. 12/144,968, entitled "METHOD AND SYSTEM FOR GROWING A THIN FILM USING A GAS CLUSTER ION BEAM", filed on Jun. 24, 2008; the entire content of this application is herein incorporated by reference.

When depositing a thin film, the forming of a thin film may include depositing a $SiO_x$, $SiN_x$, $SiC_x$, $SiO_xN_y$, $SiC_xN_y$, $SiO_xC_y$, $SiO_xC_yN_z$, a-C, $BN_x$, $BSi_xN_y$, Ge, SiGe(B), or SiC(P) film on a substrate or layer on a substrate. According to embodiments of the invention, the material source may thus comprise an oxygen-containing gas, a nitrogen-containing gas, a carbon-containing gas, a boron-containing gas, a silicon-containing gas, a phosphorous-containing gas, a hydrogen-containing gas, or a germanium-containing gas, or a combination of two or more thereof. When the material source contains gases which are incompatible, such as silane ($SiH_4$) and oxygen ($O_2$), the GCIB processing system may include a multiple nozzle gas source for independently introducing specific constituents of the material source to the GCIB. Additional details of a multiple nozzle system are provided in co-pending U.S. patent application Ser. No. 12/428,945, entitled "MULTIPLE NOZZLE GAS CLUSTER ION BEAM SYSTEM AND METHOD OF OPERATING", filed on Apr. 23, 2009. The entire content of this application is herein incorporated by reference in its entirety.

When depositing silicon, a substrate may be irradiated by a GCIB formed from a material source having a silicon-containing gas. For example, the pressurized gas mixture may comprise silane ($SiH_4$). In another example, the pressurized gas mixture may comprise disilane ($Si_2H_6$), dichlorosilane ($SiH_2C_{12}$), trichlorosilane ($SiC_{13}H$), diethylsilane ($C_4H_{12}Si$), trimethylsilane ($C_3H_{10}Si$), silicon tetrachloride ($SiC_{14}$), or silicon tetrafluoride ($SiF_4$), or a combination of two or more thereof.

When depositing an oxide such as $SiO_x$, a substrate may be irradiated by a GCIB formed from a material source having a silicon-containing gas and an oxygen-containing gas. For example, the material source may comprise silane ($SiH_4$) and $O_2$. In another example, the material source may comprise $N_2$, NO, $NO_2$, $N_2O$, or $NH_3$, or any combination of two or more thereof.

When depositing a nitride such as $SiN_x$, a substrate may be irradiated by a GCIB formed from a material source having a silicon-containing gas and a nitrogen-containing gas. For example, the material source may comprise silane ($SiH_4$) and $N_2$. In another example, the material source may comprise $N_2$, NO, $NO_2$, $N_2O$, or $NH_3$, or any combination of two or more thereof.

When depositing a carbide such as $SiC_x$, a substrate may be irradiated by a GCIB formed from a material source having a silicon-containing gas and a carbon-containing gas. For example, the material source may comprise silane ($SiH_4$) and $CH_4$. Additionally, for example, the material source may comprise silane ($SiH_4$) and methylsilane ($H_3C—SiH_3$). Furthermore, for example, the material source may comprise a silicon-containing gas and $CH_4$ (or more generally a hydrocarbon gas, i.e., $C_xH_y$), CO, or $CO_2$, or any combination of two or more thereof. Further yet, for example, the material source may comprise an alkyl silane, an alkane silane, an alkene silane, or an alkyne silane, or any combination of two or more thereof. Additionally, for example, the material source may include silane, methylsilane ($H_3C—SiH_3$), dimethylsilane ($H_3C—SiH_2—CH_3$), trimethylsilane (($CH_3)_3—SiH$), or tetramethylsilane (($CH_3)_4—Si$), or any combination of two or more thereof. When forming a carbonitride such as $SiC_xN_y$, the material source may further comprise a nitrogen-containing gas. For example, the nitrogen-containing gas may include $N_2$, $NH_3$, $NF_3$, NO, $N_2O$, or $NO_2$, or a combination of two or more thereof. The addition of a nitrogen-containing gas may permit forming a silicon carbonitride film (SiCN).

When forming a nitride such as $BN_x$, a substrate may be irradiated by a GCIB formed from a material source having a boron-containing gas and a nitrogen-containing gas. For example, the material source may comprise diborane ($B_2H_6$) and $N_2$. In another example, the material source may comprise $N_2$, NO, $NO_2$, $N_2O$, or $NH_3$, or any combination of two or more thereof.

When forming a nitride such as $BSi_xN_y$, a substrate may be irradiated by a GCIB formed from a material source having a silicon-containing gas, a boron-containing gas, and a nitrogen-containing gas. For example, the material source may comprise silane ($SiH_4$), diborane ($B_2H_6$) and $N_2$. In another example, the material source may comprise $N_2$, NO, $NO_2$, $N_2O$, or $NH_3$, or any combination of two or more thereof.

Exemplary data for depositing a thin film using a GCIB is provided in pending U.S. patent application Ser. No. 12/049, 583, entitled "METHOD AND SYSTEM FOR DEPOSITING SILICON CARBIDE FILM USING A GAS CLUSTER ION BEAM", filed on Mar. 17, 2008; the entire content of this application is herein incorporated by reference.

In any one of the above examples, the material source may comprise an optional inert gas. The optional inert gas may comprise a noble gas.

Referring again to FIG. 2, in 450, the directionality of the GCIB relative to the substrate is controlled to adjust a first amount of the thin film formed on the one or more first surfaces relative to a second amount of the thin film formed on the one or more second surfaces. The directionality of the GCIB may be altered by modifying the beam energy, the beam energy distribution, the beam focus, or the beam dose, or any combination of two or more thereof. For example, the directionality of the GCIB relative to the substrate may be controlled in order to form the thin film on the one or more first surfaces, while substantially avoiding formation of the thin film on the one or more second surfaces. Furthermore, the controlling of the directionality of the GCIB relative to the substrate may cause formation on one or more third surfaces transitioning between the one or more first surfaces and the one or more second surfaces. As shown in FIG. 3B, the forming of the thin film 530 on the one or more first surfaces 550 may cause formation on one or more third surfaces 554 transitioning between the one or more first surfaces 550 and the one or more second surfaces 552.

Figure 3C:
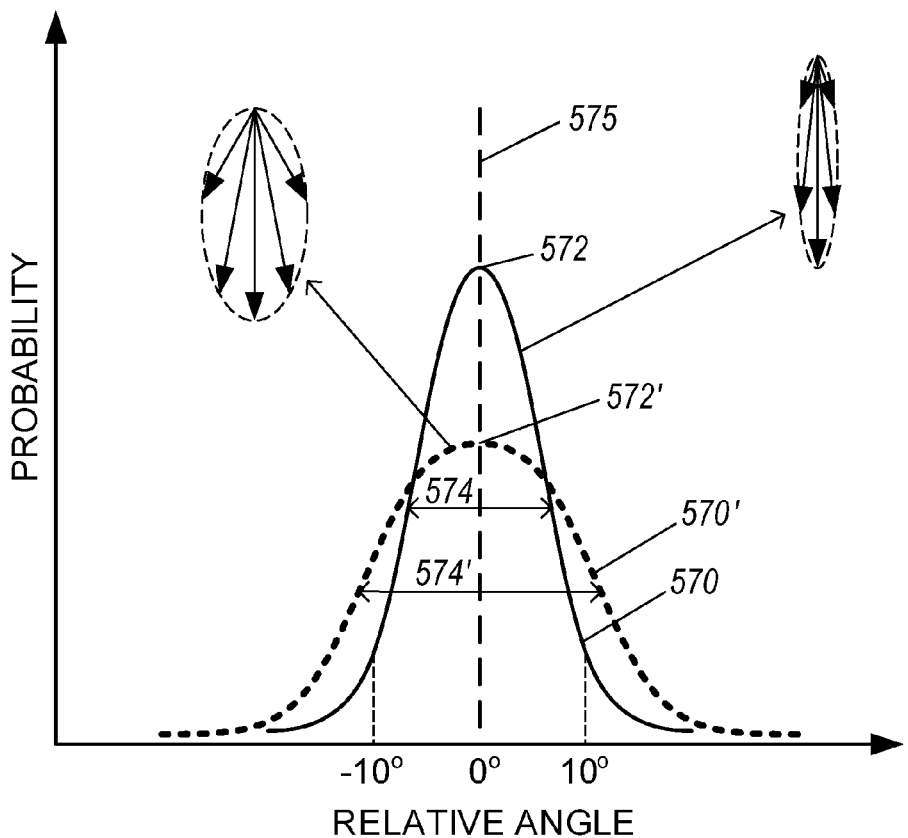
FIG. 3C provides a schematic graphical illustration of an angular distribution function for a GCIB.

As shown in FIG. 3A, the directionality of the GCIB 520 may be represented by the direction of incidence 521 of the GCIB 520 and a beam divergence 522 for GCIB 520. The beam divergence 522 may be illustrated in an angular distribution function relating the probability of a cluster traveling in a specific direction relative to the direction of incidence of the GCIB. For example, FIG. 3C graphically illustrates a first angular distribution function 570 characterized by a first peak 572 at a direction of incidence 575 (i.e., relative angle is 0°) and a first width 574 (e.g., a full-width at half maximum (FWHM)). Additionally, for example, FIG. 3C illustrates a second angular distribution function 570' characterized by a second peak 572' at the direction of incidence 575 (i.e., relative angle is 0°) and a second width 574' (e.g., a full-width at half maximum (FWHM)). The first angular distribution 570 represents a narrow distribution, while the second angular distribution 570' represents a relatively broader distribution. Hence, the directionality of the GCIB may be adjusted by altering the direction of incidence 575 of the GCIB (relative to the substrate) and/or altering the angular distribution function (e.g., changing the angular distribution between the first angular distribution function 570 and the second angular distribution function 570').

The beam divergence 522 may range up to 20°. Alternatively, the beam divergence 522 may range up to 10°.

According to one embodiment, the directionality of the GCIB 520 relative to substrate 505 may be controlled by adjusting the direction of incidence 521 of GCIB 520 via change to the orientation of substrate 505 relative to the direction of incidence 521 of GCIB 520. The orientation of substrate 505 may be altered by changing the inclination angle 570 (i.e., tilting the substrate 505 relative to the direction of incidence 521 of GCIB 520). Therein, the direction of incidence 521 of GCIB 520 is changed relative to substrate 505, the first surfaces 550, and the second surfaces 552.

According to another embodiment, the directionality of the GCIB 520 relative to substrate 505 may be controlled by adjusting the beam divergence 522 of GCIB 520 via change to the angular distribution function of GCIB 520. The angular distribution function of GCIB 520 may be altered by modifying the beam energy, the beam energy distribution, or the beam focus, or any combination of two or more thereof.

As an example, an increase in the beam energy (e.g., higher acceleration potential) may cause a narrowing of the angular distribution function for the GCIB, while a decrease in the beam energy may cause a broadening of the angular distribution function. As another example, a narrowing of the beam energy distribution function may cause a narrowing of the angular distribution function for the GCIB, while a broadening of the beam energy distribution function may cause a broadening of the angular distribution function. As yet another example, a focusing of the GCIB may cause a narrowing of the angular distribution function for the GCIB, while a de-focusing of the GCIB may cause a broadening of the angular distribution function.

The beam energy distribution function of the GCIB may be modified by directing the GCIB along a GCIB path through an increased pressure (to be discussed in greater detail below). As an example, the path length (d) of the pressure cell may be set to d~23.3 cm and the pressure in the pressure cell may be elevated by introducing a background gas. For instance, when the background gas is introduced at a flow rate of 15 sccm (standard cubic centimeters per minute) ("15P") to the pressure cell, the pressure-distance integral is about 0.002 torr-cm. Additionally, for instance, when the background gas is introduced at a flow rate of 40 sccm ("40P") to the pressure cell, the pressure-distance integral is about 0.005 torr-cm. Alternatively, the beam energy distribution function of the GCIB may be modified by altering the charge state of the GCIB (to be discussed in greater detail below).

Figure 4:
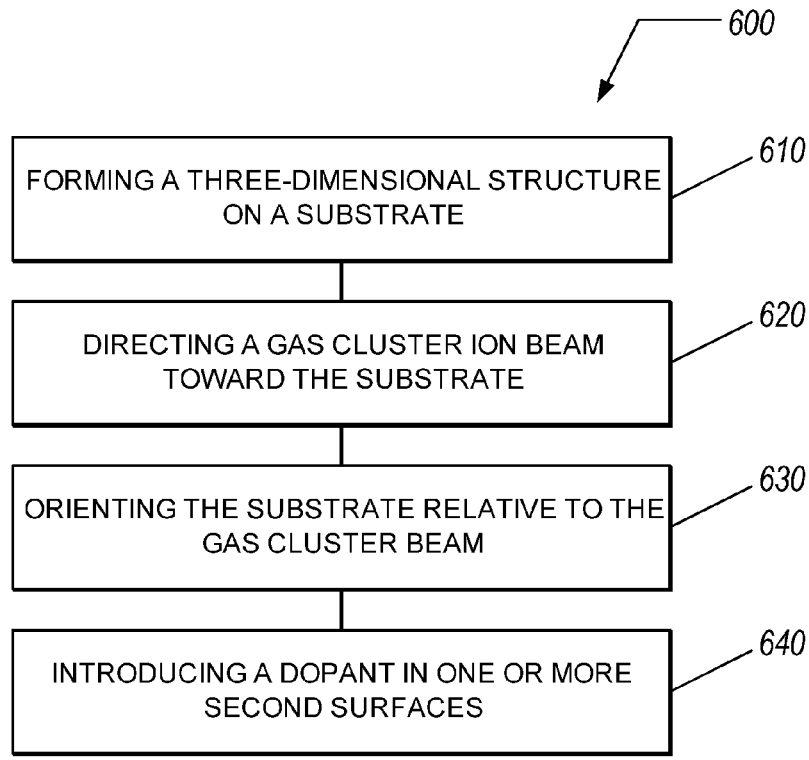
FIG. 4 is a flow chart illustrating a method of doping a structure according to another embodiment.
Figure 5A:
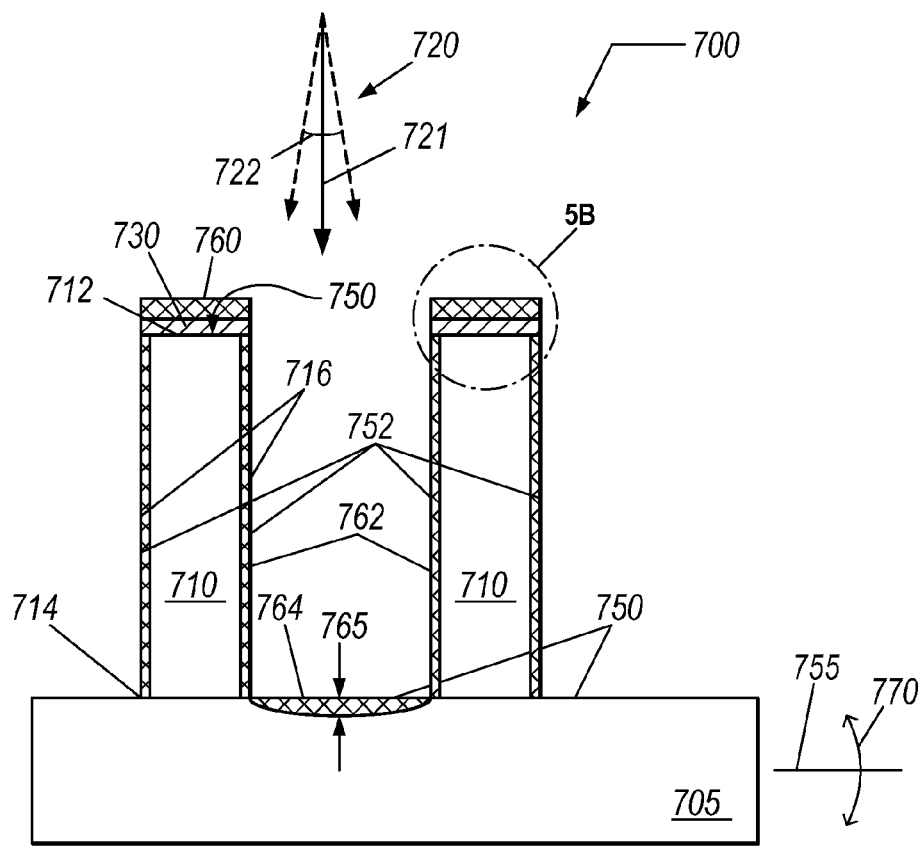
FIG. 5A provides a schematic cross-sectional view of a structure according to another embodiment.
Figure 5B:
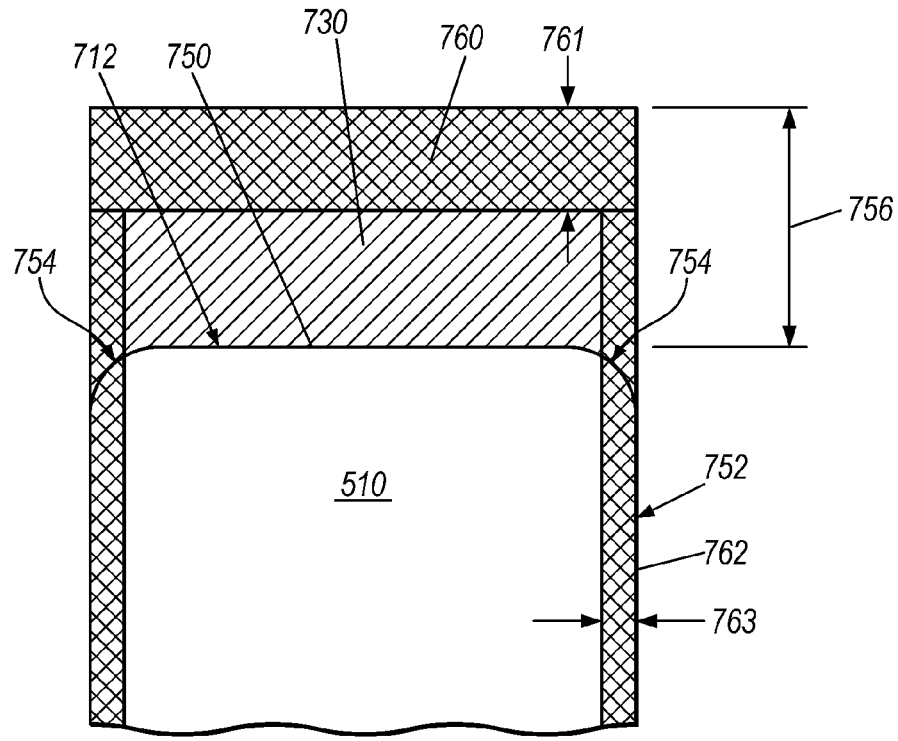
FIG. 5B provides an enlarged view of the encircled portion 5B of the structure depicted in FIG. 5A.

Referring now to FIGS. 4, 5A, and 5B, a method for doping a structure, such as a 3D structure, is described according to another embodiment. The method is illustrated by a flow chart 600 beginning in 610 with forming a 3D structure on a substrate, wherein the 3D structure has a plurality of surfaces including one or more first surfaces lying substantially parallel to a first plane parallel with the substrate, and one or more second surfaces lying substantially perpendicular to said first plane. The substrate can include a conductive material, a non-conductive material, or a semi-conductive material, or a combination of two or more materials thereof. Additionally, the substrate may include one or more material structures formed thereon, or the substrate may be a blanket substrate free of material structures. For example, the structure may comprise a multi-gate field-effect transistor (MuFET), or a fin field-effect transistor (FinFET). Additionally, for example, the structure may comprise a via, a contact, a trench, a film stack, etc.

As shown in FIGS. 5A and 5B, a schematic cross-sectional view of a structure 700 is illustrated according to an embodiment. The structure 700 comprises one or more fins 710, each having a base 714 at a base surface of a substrate 705, a top surface 712, two sidewalls 716 substantially parallel with one another extending between the base 714 and the top surface 712, and at least one end wall (not shown) extending between the base 714 and the top surface 716 and extending between the two sidewalls 716. At least one of the first surfaces 750, which include the top surface 712 of each fin 710 and the base surface at the substrate 705, is oriented substantially parallel with a first plane 755 (i.e., the plane within which substrate 705 lies). As shown in FIG. 5A, the first plane 755 may be substantially perpendicular to a GCIB 720. In one embodiment, each of the first surfaces 750 is oriented substantially parallel with the first plane 755. Further, at least one of the second surfaces 752, which include sidewalls 716, is oriented substantially perpendicular with the first plane 755. In one embodiment, each of the second surfaces 752 is oriented substantially perpendicular with the first plane 755.

As an example, one or more second surfaces 752 that are substantially perpendicular to the first plane 755 may comprise an angular deviation of up to about 25 degrees from a surface normal of the first plane 755. Alternatively, one or more second surfaces 752 that are substantially perpendicular to the first plane 755 may comprise an angular deviation of up to about 20 degrees from a surface normal of the first plane 755. Alternatively, one or more second surfaces 752 that are substantially perpendicular to the first plane 755 may comprise an angular deviation of up to about 10 degrees from a surface normal of the first plane 755. Alternatively yet, one or more second surfaces 752 that are substantially perpendicular to the first plane 755 may comprise an angular deviation of up to about 5 degrees from a surface normal of the first plane 755.

Consequently, one or more first surfaces 750 that are substantially parallel with the first plane 755 may comprise an angular deviation greater than about 75 degrees from a surface normal of the first plane 755. Alternatively, one or more first surfaces 750 that are substantially parallel with the first plane 755 may comprise an angular deviation greater than about 80 degrees from a surface normal of the first plane 755. Alternatively, one or more first surfaces 750 that are substantially parallel with the first plane 755 may comprise an angular deviation greater than about 85 degrees from a surface normal of the first plane 755. Alternatively yet, one or more first surfaces 750 that are substantially parallel with the first plane 755 may comprise an angular deviation greater than about 90 degrees from a surface normal of the first plane 755.

Referring again to FIG. 4, in 620, a gas cluster ion beam (GCIB) formed from a material source for a dopant is directed toward the substrate with a direction of incidence relative to the substrate. The deviation of the direction of incidence of the GCIB may vary plus or minus about 1 to 3 degrees due to variations in the GCIB processing equipment. The GCIB processing system can be any of the GCIB processing systems (100, 100' or 100") described in FIG. 7, 8, or 9 (described below), or any combination thereof.

The substrate can be disposed in a GCIB processing system. The substrate can be positioned on a substrate holder and may be securely held by the substrate holder, wherein the substrate holder locates the substrate relative to the GCIB. The temperature of the substrate may or may not be controlled. For example, the substrate may be heated or cooled during a film forming process. The environment surrounding the substrate is maintained at a reduced pressure.

In 630, the substrate is oriented relative to the direction of incidence. For example, as shown in FIG. 5A, GCIB 720 is directed at substrate 705 along a direction of incidence 721 substantially normal to substrate 705. Therein, the orientation of substrate 705 relative to the direction of incidence 721 of GCIB 720 may be varied by adjusting an inclination angle 770 of substrate 705 relative to GCIB 720.

In 640, a dopant is introduced in one or more of the second surfaces. As shown in FIG. 5A, a thin doped sublayer 762 is formed in at least one second surface 752, specifically the sidewalls 716 of fins 710. Additionally, another thin doped sublayer 760 is formed at an upper surface of fin 710. For example, the thin doped sublayer 760 may be formed at an upper surface of a screening layer 730 applied to at least one first surface 750, specifically the top surfaces 712 of fins 710. The screening layer 730 may be formed prior to introducing dopant to the sidewalls 716 of fins 710. Additionally, as shown in FIG. 5A, yet another doped sublayer 764 may be formed on another first surface 750, specifically the base surface adjacent base 714 of fins 710. Introducing the dopant in the second surfaces comprises using a material source having one or more elements (hereafter "element(s)") selected from the group consisting of B, C, Si, Ge, N, P, As, O, S, and Cl.

The formation of the doped sublayer 762 in 640 utilizing the GCIB 720 may comprise selecting a beam energy, a beam energy distribution, a beam focus, and a beam dose to achieve a desired penetration depth of the dopant in the second surfaces 752. Additionally, the formation of the GCIB 720 may comprise accelerating the GCIB 720 to achieve the beam energy, focusing the GCIB 720 to achieve the beam focus, irradiating the accelerated GCIB 720 onto at least a portion of the substrate 705 according to the beam dose, and introducing the dopant to that irradiated portion of the substrate 705 to achieve the penetration depth.

As discussed above, beam dose is given the units of number of clusters per unit area. However, beam dose may also include beam current and/or time (e.g., GCIB dwell time). For example, the beam current may be measured and maintained constant, while time is varied to change the beam dose. Alternatively, for example, the rate at which clusters strike the surface of the substrate per unit area (i.e., number of clusters per unit area per unit time) may be held constant while the time is varied to change the beam dose.

Additionally, other GCIB properties may be varied to adjust the penetration depth, and other film properties such as the dopant concentration and/or dopant concentration profile, including, but not limited to, gas flow rate, stagnation pressure, cluster size, or gas nozzle design (such as nozzle throat diameter, nozzle length, and/or nozzle divergent section half-angle). Furthermore, other film properties may be varied by adjusting the GCIB properties including, but not limited to, sublayer composition, sublayer quality, etc.

As shown in FIGS. 5A and 5B, the thin doped sublayer 762 of penetration depth 763 is formed in the second surfaces 752, specifically the sidewalls 716 of fins 710. Additionally, the thin doped sublayer 760 of penetration depth 761 is formed within the screening layer 730 of thickness 756 on the first surfaces 750, which include the top surfaces 712 of fins 710. Furthermore, the doped sublayer 764 of penetration depth 765 is formed in the first surface 750 that includes the base surface adjacent base 714 of fins 710. Further yet, the introduction of dopant to the top surfaces 712 of fins 710 may be substantially avoided as shown due to the screening layer 730.

The penetration depth 763 may range up to about 50 nm (nanometers). Alternatively, the penetration depth 763 may range up to about 20 nm. Alternatively, the penetration depth 763 may range up to about 10 nm. Alternatively, the penetration depth 763 may range up to about 5 nm. Alternatively, the penetration depth 763 may range up to about 4 nm. Alternatively yet, the penetration depth 763 may range from about 2 nm to about 5 nm.

The penetration depth 761 may range up to about 50 nm (nanometers). Alternatively, the penetration depth 761 may range up to about 30 nm. Alternatively, the penetration depth 761 may range up to about 20 nm. Alternatively, the penetration depth 761 may range up to about 15 nm. Alternatively, the penetration depth 761 may range up to about 10 nm. Alternatively yet, the penetration depth 761 may range from about 7 nm to about 10 nm.

The penetration depth 765 may range up to about 50 nm (nanometers). Alternatively, the penetration depth 765 may range up to about 30 nm. Alternatively, the penetration depth 765 may range up to about 20 nm. Alternatively, the penetration depth 765 may range up to about 15 nm. Alternatively, the penetration depth 765 may range up to about 10 nm. Alternatively yet, the penetration depth 765 may range from about 7 nm to about 10 nm.

A directionality of the GCIB relative to the substrate may be controlled to adjust a first amount of the dopant introduced to the first surfaces relative to a second amount of the dopant introduced to the second surfaces. The directionality of the GCIB may be altered by modifying the beam energy, the beam energy distribution, the beam focus, or the beam dose, or any combination of two or more thereof. For example, the directionality of the GCIB relative to the substrate may be controlled in order to introduce dopant to one or more second surfaces, while attempting to reduce or minimize the introduction of dopant to one or more first surfaces.

As discussed above in reference to FIG. 3A, the directionality of the GCIB may be represented by the direction of incidence of the GCIB and a beam divergence for GCIB. The beam divergence may be determined from an angular distribution function relating the probability of a cluster traveling in a specific direction relative to the direction of incidence of the GCIB. Hence, the directionality of the GCIB may be adjusted by altering the direction of incidence of the GCIB (relative to the substrate) and/or altering the angular distribution function.

Referring to FIG. 5A, according to one embodiment, the directionality of the GCIB 720 relative to substrate 705 may be controlled by adjusting the direction of incidence 721 of GCIB 720 via change to the orientation of substrate 705 relative to the direction of incidence 721 of GCIB 720. The orientation of substrate 705 may be altered by changing the inclination angle 770 (i.e., tilting the substrate 705 relative to the direction of incidence 721 of GCIB 720). Therein, the direction of incidence 721 of GCIB 720 is changed relative to substrate 705, the first surfaces 750, and the second surfaces 752.

According to another embodiment, the directionality of the GCIB 720 relative to substrate 705 may be controlled by adjusting the beam divergence 722 of GCIB 720 via change to the angular distribution function of GCIB 720. The angular distribution function of GCIB 720 may be altered by modifying the beam energy, the beam energy distribution, or the beam focus, or any combination of two or more thereof. The beam divergence 722 may range up to 20°. Alternatively, the beam divergence 722 may range up to 10°.

As an example, an increase in the beam energy (e.g., higher acceleration potential) may cause a narrowing of the angular distribution function for the GCIB, while a decrease in the beam energy may cause a broadening of the angular distribution function. As another example, a narrowing of the beam energy distribution function may cause a narrowing of the angular distribution function for the GCIB, while a broadening of the beam energy distribution function may cause a broadening of the angular distribution function. As yet another example, a focusing of the GCIB may cause a narrowing of the angular distribution function for the GCIB, while a de-focusing of the GCIB may cause a broadening of the angular distribution function.

The beam energy distribution function of the GCIB may be modified by directing the GCIB along a GCIB path through an increased pressure (to be discussed in greater detail below). As an example, the path length (d) of the pressure cell may be set to d~23.3 cm and the pressure in the pressure cell may be elevated by introducing a background gas. For instance, when the background gas is introduced at a flow rate of 15 sccm (standard cubic centimeters per minute) ("15P") to the pressure cell, the pressure-distance integral is about 0.002 torr-cm. Additionally, for instance, when the background gas is introduced at a flow rate of 40 sccm ("40P") to the pressure cell, the pressure-distance integral is about 0.005 torr-cm. Alternatively, the beam energy distribution function of the GCIB may be modified by altering the charge state of the GCIB (to be discussed in greater detail below).

Although FIGS. 4, 5A, and 5B address doping the sidewall of a structure, the treatment of the sidewall may include one or more other GCIB processes. For example, the treatment of one or more second surfaces using a GCIB may include doping, etching, cleaning, depositing a thin film on, growing a thin film on, modifying a property of, or smoothing the one or more second surfaces, or any combination of two or more thereof. Additionally, for example, surface modification of one or more second surfaces may include modification of an optical, a thermal, a mechanical, a chemical, and/or an electrical property of the one or more second surfaces, such as a refractive index, a thermal conductivity, a thermal stability, an elastic modulus, a hardness, a dielectric constant, a work function, a chemical resistance to, for example, various etch chemistries, etc.

Figure 6:
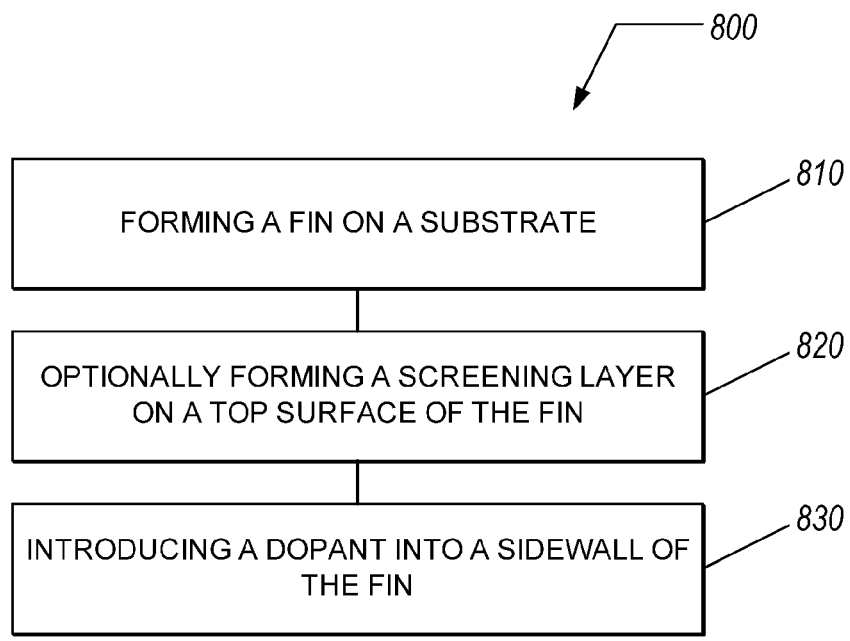
FIG. 6 is a flow chart illustrating a method of preparing a structure according to yet another embodiment.

Referring now to FIG. 6, a method for preparing a 3D structure is described according to another embodiment. The method is illustrated by a flow chart 800 beginning in 810 with forming a fin on a substrate. The fin may include any one of the fin structures described in FIGS. 1, 3A, and 5A. For example, the fin may be utilized as a source and drain in a 3D gate structure.

In 820, a screening layer is optionally formed on a top surface of the fin. The formation of the screening layer may include growing the screening layer and/or depositing the screening layer. Additionally, the screening layer may be deposited and/or grown using a conventional technique, such as a thermal oxidation process, a vapor deposition process, a sputter deposition, a physical vapor deposition process, an ionized physical vapor deposition process, a chemical vapor deposition process, or a plasma-enhanced chemical vapor deposition process. Any one of these processes may be followed by an etching process to remove material from a sidewall of the fin. Alternatively, the screening layer may be deposited and/or grown using a GCIB as described above. For example, the screening layer may comprise a layer of silicon oxide ($SiO_x$), silicon nitride ($SiN_y$), silicon oxynitride ($SiO_xN_y$), silicon-germanium (SiGe), or germanium (Ge).

In 830, a dopant is introduced to a sidewall of the fin. The dopant may be introduced using a conventional technique, such as an ion implantation process or a plasma immersion ion implantation process. Alternatively, the dopant may be introduced using a GCIB as described above. The dopant may comprise one or more elements selected from the group consisting of B, C, Si, Ge, N, P, As, O, S, and Cl.

Furthermore, a pre-treatment process and/or post-treatment process may be performed to adjust one or more properties of the screening layer and/or doped sidewall including, but not limited to, a film thickness, a film roughness, a film adhesion, a film composition, a dopant concentration, a dopant concentration profile, etc. The pre-treatment process and/or the post-treatment process may include exposure to an ion source, a GCIB source, a photon source, an electron source, a plasma source, a microwave radiation source, a thermal source, an electro-magnetic (EM) radiation source, etc. For example, a pre-treatment process may include exposing the substrate to another GCIB, exposing the substrate to a slotted plane antenna (SPA) plasma, or exposing the substrate to electro-magnetic (EM) radiation, or any combination of two or more thereof. The exposure to another GCIB may include performing an inert GCIB process or a GCIB growth process to, for instance, improve adhesion and/or assist the ensuing GCIB growth and/or deposition process to form the thin film. Additionally, for example, a post-treatment process may include exposing the substrate to another GCIB, annealing the substrate, exposing the substrate to a slotted plane antenna (SPA) plasma, or exposing the substrate to electro-magnetic (EM) radiation, or any combination of two or more thereof.

Figure 7:
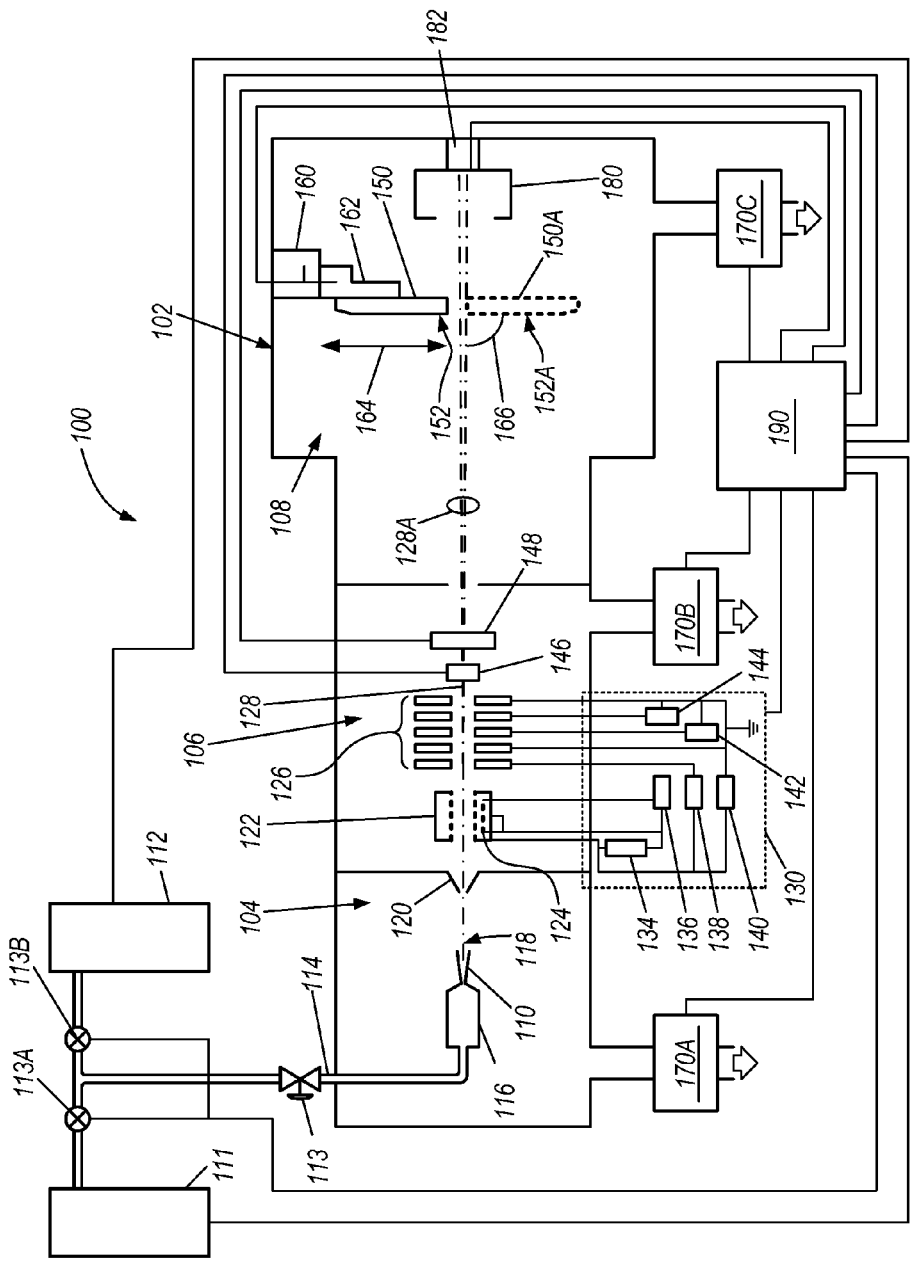
FIG. 7 is a schematic illustration of a GCIB processing system.

Referring now to FIG. 7, a GCIB processing system 100 for forming the ultra-thin films as described above is depicted according to an embodiment. The GCIB processing system 100 comprises a vacuum vessel 102, substrate holder 150, upon which a substrate 152 to be processed is affixed, and vacuum pumping systems 170A, 170B, and 170C. Substrate 152 can be a semiconductor substrate, a wafer, a flat panel display (FPD), a liquid crystal display (LCD), or any other workpiece. GCIB processing system 100 is configured to produce a GCIB for treating substrate 152.

Referring still to GCIB processing system 100 in FIG. 7, the vacuum vessel 102 comprises three communicating chambers, namely, a source chamber 104, an ionization/acceleration chamber 106, and a processing chamber 108 to provide a reduced-pressure enclosure. The three chambers are evacuated to suitable operating pressures by vacuum pumping systems 170A, 170B, and 170C, respectively. In the three communicating chambers 104, 106, 108, a gas cluster beam can be formed in the first chamber (source chamber 104), while a GCIB can be formed in the second chamber (ionization/acceleration chamber 106) wherein the gas cluster beam is ionized and accelerated. Then, in the third chamber (processing chamber 108), the accelerated GCIB may be utilized to treat substrate 152.

As shown in FIG. 7, GCIB processing system 100 can comprise a material source having one or more gas sources configured to introduce one or more gases or mixture of gases to vacuum vessel 102. For example, a first gas composition stored in a first gas source 111 is admitted under pressure through a first gas control valve 113A to a gas metering valve or valves 113. Additionally, for example, a second gas composition stored in a second gas source 112 is admitted under pressure through a second gas control valve 113B to the gas metering valve or valves 113. Furthermore, for example, the first gas composition or the second gas composition or both can comprise a film-forming gas composition, or a dopant source gas composition. Further yet, for example, the first gas composition or second gas composition or both can include a condensable inert gas, carrier gas or dilution gas. For example, the inert gas, carrier gas or dilution gas can include a noble gas, i.e., He, Ne, Ar, Kr, Xe, or Rn.

Furthermore, the first gas source 111 and the second gas source 112 may be utilized either alone or in combination with one another to produce ionized clusters. The film-forming gas composition can comprise a film precursor or precursors that include the principal atomic or molecular species of the film desired to be produced, deposited, or grown on the substrate. The dopant source gas composition can comprise dopant(s) desired for introduction into one or more surfaces of the substrate.

The high pressure, condensable gas comprising the first gas composition or the second gas composition or both is introduced through gas feed tube 114 into stagnation chamber 116 and is ejected into the substantially lower pressure vacuum through a properly shaped nozzle 110. As a result of the expansion of the high pressure, condensable gas from the stagnation chamber 116 to the lower pressure region of the source chamber 104, the gas velocity accelerates to supersonic speeds and gas cluster beam 118 emanates from nozzle 110.

The inherent cooling of the jet as static enthalpy is exchanged for kinetic energy, which results from the expansion in the jet, causes a portion of the gas jet to condense and form a gas cluster beam 118 having clusters, each consisting of from several to several thousand weakly bound atoms or molecules. A gas skimmer 120, positioned downstream from the exit of the nozzle 110 between the source chamber 104 and ionization/acceleration chamber 106, partially separates the gas molecules on the peripheral edge of the gas cluster beam 118, that may not have condensed into a cluster, from the gas molecules in the core of the gas cluster beam 118, that may have formed clusters. Among other reasons, this selection of a portion of gas cluster beam 118 can lead to a reduction in the pressure in the downstream regions where higher pressures may be detrimental (e.g., ionizer 122, and processing chamber 108). Furthermore, gas skimmer 120 defines an initial dimension for the gas cluster beam entering the ionization/acceleration chamber 106.

After the gas cluster beam 118 has been formed in the source chamber 104, the constituent gas clusters in gas cluster beam 118 are ionized by ionizer 122 to form GCIB 128. The ionizer 122 may include an electron impact ionizer that produces electrons from one or more filaments 124, which are accelerated and directed to collide with the gas clusters in the gas cluster beam 118 inside the ionization/acceleration chamber 106. Upon collisional impact with the gas cluster, electrons of sufficient energy eject electrons from molecules in the gas clusters to generate ionized molecules. The ionization of gas clusters can lead to a population of charged gas cluster ions, generally having a net positive charge.

As shown in FIG. 7, beam electronics 130 are utilized to ionize, extract, accelerate, and focus the GCIB 128. The beam electronics 130 include a filament power supply 136 that provides voltage $V_F$ to heat the ionizer filament 124.

Additionally, the beam electronics 130 include a set of suitably biased high voltage electrodes 126 in the ionization/acceleration chamber 106 that extracts the cluster ions from the ionizer 122. The high voltage electrodes 126 then accelerate the extracted cluster ions to a desired energy and focus them to define GCIB 128. The kinetic energy of the cluster ions in GCIB 128 typically ranges from about 1000 electron volts (1 keV) to several tens of keV. For example, GCIB 128 can be accelerated to 1 to 100 keV.

As illustrated in FIG. 7, the beam electronics 130 further include an anode power supply 134 that provides voltage $V_A$ to an anode of ionizer 122 for accelerating electrons emitted from filament 124 and causing the electrons to bombard the gas clusters in gas cluster beam 118, which produces cluster ions.

Additionally, as illustrated in FIG. 7, the beam electronics 130 include an extraction power supply 138 that provides voltage $V_E$ to bias at least one of the high voltage electrodes 126 to extract ions from the ionizing region of ionizer 122 and to form the GCIB 128. For example, extraction power supply 138 provides a voltage to a first electrode of the high voltage electrodes 126 that is less than or equal to the anode voltage of ionizer 122.

Furthermore, the beam electronics 130 can include an accelerator power supply 140 that provides voltage $V_{Acc}$ to bias one of the high voltage electrodes 126 with respect to the ionizer 122 so as to result in a total GCIB acceleration energy equal to about $V_{Acc}$ electron volts (eV). For example, accelerator power supply 140 provides a voltage to a second electrode of the high voltage electrodes 126 that is less than or equal to the anode voltage of ionizer 122 and the extraction voltage of the first electrode.

Further yet, the beam electronics 130 can include lens power supplies 142, 144 that may be provided to bias some of the high voltage electrodes 126 with potentials (e.g., $V_{L1}$ and $V_{L2}$) to focus the GCIB 128. For example, lens power supply 142 can provide a voltage to a third electrode of the high voltage electrodes 126 that is less than or equal to the anode voltage of ionizer 122, the extraction voltage of the first electrode, and the accelerator voltage of the second electrode, and lens power supply 144 can provide a voltage to a fourth electrode of the high voltage electrodes 126 that is less than or equal to the anode voltage of ionizer 122, the extraction voltage of the first electrode, the accelerator voltage of the second electrode, and the first lens voltage of the third electrode.

Note that many variants on both the ionization and extraction schemes may be used. While the scheme described here is useful for purposes of instruction, another extraction scheme involves placing the ionizer and the first element of the extraction electrode(s) (or extraction optics) at $V_{Acc}$. This typically requires fiber optic programming of control voltages for the ionizer power supply, but creates a simpler overall optics train. The invention described herein is useful regardless of the details of the ionizer and extraction lens biasing.

A beam filter 146 in the ionization/acceleration chamber 106 downstream of the high voltage electrodes 126 can be utilized to eliminate monomers, or monomers and light cluster ions from the GCIB 128 to define a filtered process GCIB 128A that enters the processing chamber 108. In one embodiment, the beam filter 146 substantially reduces the number of clusters having 100 or less atoms or molecules or both. The beam filter may comprise a magnet assembly for imposing a magnetic field across the GCIB 128 to aid in the filtering process.

Referring still to FIG. 7, a beam gate 148 is disposed in the path of GCIB 128 in the ionization/acceleration chamber 106. Beam gate 148 has an open state in which the GCIB 128 is permitted to pass from the ionization/acceleration chamber 106 to the processing chamber 108 to define process GCIB 128A, and a closed state in which the GCIB 128 is blocked from entering the processing chamber 108. A control cable conducts control signals from control system 190 to beam gate 148. The control signals controllably switch beam gate 148 between the open or closed states.

A substrate 152, which may be a wafer or semiconductor wafer, a flat panel display (FPD), a liquid crystal display (LCD), or other substrate to be processed by GCIB processing, is disposed in the path of the process GCIB 128A in the processing chamber 108. Because most applications contemplate the processing of large substrates with spatially uniform results, a scanning system may be desirable to uniformly scan the process GCIB 128A across large areas to produce spatially homogeneous results.

An X-scan actuator 160 provides linear motion of the substrate holder 150 in the direction of X-scan motion (into and out of the plane of the paper). A Y-scan actuator 162 provides linear motion of the substrate holder 150 in the direction of Y-scan motion 164, which is typically orthogonal to the X-scan motion. The combination of X-scanning and Y-scanning motions translates the substrate 152, held by the substrate holder 150, in a raster-like scanning motion through process GCIB 128A to cause a uniform (or otherwise programmed) irradiation of a surface of the substrate 152 by the process GCIB 128A for processing of the substrate 152.

The substrate holder 150 disposes the substrate 152 at an angle with respect to the axis of the process GCIB 128A so that the process GCIB 128A has an angle of beam incidence 166 with respect to a substrate 152 surface. The angle of beam incidence 166 may be 90 degrees or some other angle, but is typically 90 degrees or near 90 degrees. During Y-scanning, the substrate 152 and the substrate holder 150 move from the shown position to the alternate position "A" indicated by the designators 152A and 150A, respectively. Notice that in moving between the two positions, the substrate 152 is scanned through the process GCIB 128A, and in both extreme positions, is moved completely out of the path of the process GCIB 128A (over-scanned). Though not shown explicitly in FIG. 7, similar scanning and over-scan is performed in the (typically) orthogonal X-scan motion direction (in and out of the plane of the paper).

A beam current sensor 180 may be disposed beyond the substrate holder 150 in the path of the process GCIB 128A so as to intercept a sample of the process GCIB 128A when the substrate holder 150 is scanned out of the path of the process GCIB 128A. The beam current sensor 180 is typically a Faraday cup or the like, closed except for a beam-entry opening, and is typically affixed to the wall of the vacuum vessel 102 with an electrically insulating mount 182.

As shown in FIG. 7, control system 190 connects to the X-scan actuator 160 and the Y-scan actuator 162 through electrical cable and controls the X-scan actuator 160 and the Y-scan actuator 162 in order to place the substrate 152 into or out of the process GCIB 128A and to scan the substrate 152 uniformly relative to the process GCIB 128A to achieve desired processing of the substrate 152 by the process GCIB 128A. Control system 190 receives the sampled beam current collected by the beam current sensor 180 by way of an electrical cable and, thereby, monitors the GCIB and controls the GCIB dose received by the substrate 152 by removing the substrate 152 from the process GCIB 128A when a predetermined dose has been delivered.

Figure 8:
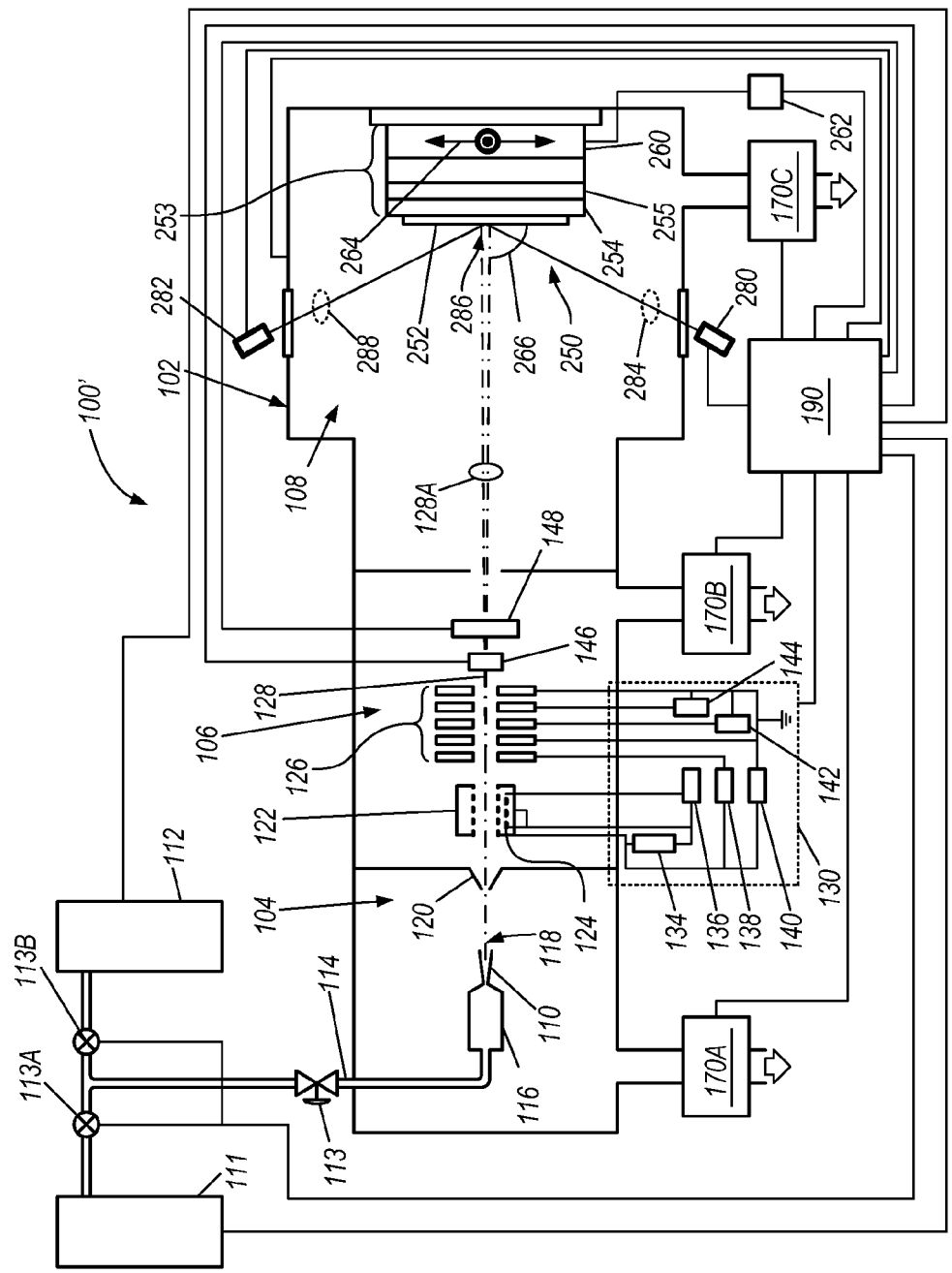
FIG. 8 is another schematic illustration of a GCIB processing system.

In the embodiment shown in FIG. 8, the GCIB processing system 100' can be similar to the embodiment of FIG. 7 and further comprise a X-Y positioning table 253 operable to hold and move a substrate 252 in two axes, effectively scanning the substrate 252 relative to the process GCIB 128A. For example, the X-motion can include motion into and out of the plane of the paper, and the Y-motion can include motion along direction 264.

The process GCIB 128A impacts the substrate 252 at a projected impact region 286 on a surface of the substrate 252, and at an angle of beam incidence 266 with respect to the surface of substrate 252. By X-Y motion, the X-Y positioning table 253 can position each portion of a surface of the substrate 252 in the path of process GCIB 128A so that every region of the surface may be made to coincide with the projected impact region 286 for processing by the process GCIB 128A. An X-Y controller 262 provides electrical signals to the X-Y positioning table 253 through an electrical cable for controlling the position and velocity in each of X-axis and Y-axis directions. The X-Y controller 262 receives control signals from, and is operable by, control system 190 through an electrical cable. X-Y positioning table 253 moves by continuous motion or by stepwise motion according to conventional X-Y table positioning technology to position different regions of the substrate 252 within the projected impact region 286. In one embodiment, X-Y positioning table 253 is programmably operable by the control system 190 to scan, with programmable velocity, any portion of the substrate 252 through the projected impact region 286 for GCIB processing by the process GCIB 128A.

The substrate holding surface 254 of positioning table 253 is electrically conductive and is connected to a dosimetry processor operated by control system 190. An electrically insulating layer 255 of positioning table 253 isolates the substrate 252 and substrate holding surface 254 from the base portion 260 of the positioning table 253. Electrical charge induced in the substrate 252 by the impinging process GCIB 128A is conducted through substrate 252 and substrate holding surface 254, and a signal is coupled through the positioning table 253 to control system 190 for dosimetry measurement. Dosimetry measurement has integrating means for integrating the GCIB current to determine a GCIB processing dose. Under certain circumstances, a target-neutralizing source (not shown) of electrons, sometimes referred to as electron flood, may be used to neutralize the process GCIB 128A. In such case, a Faraday cup (not shown, but which may be similar to beam current sensor 180 in FIG. 7) may be used to assure accurate dosimetry despite the added source of electrical charge, the reason being that typical Faraday cups allow only the high energy positive ions to enter and be measured.

In operation, the control system 190 signals the opening of the beam gate 148 to irradiate the substrate 252 with the process GCIB 128A. The control system 190 monitors measurements of the GCIB current collected by the substrate 252 in order to compute the accumulated dose received by the substrate 252. When the dose received by the substrate 252 reaches a predetermined dose, the control system 190 closes the beam gate 148 and processing of the substrate 252 is complete. Based upon measurements of the GCIB dose received for a given area of the substrate 252, the control system 190 can adjust the scan velocity in order to achieve an appropriate beam dwell time to treat different regions of the substrate 252.

Alternatively, the process GCIB 128A may be scanned at a constant velocity in a fixed pattern across the surface of the substrate 252; however, the GCIB intensity is modulated (may be referred to as Z-axis modulation) to deliver an intentionally non-uniform dose to the sample. The GCIB intensity may be modulated in the GCIB processing system 100' by any of a variety of methods, including varying the gas flow from a GCIB source supply; modulating the ionizer 122 by either varying a filament voltage $V_F$ or varying an anode voltage $V_A$; modulating the lens focus by varying lens voltages $V_{L1}$ and/or $V_{L2}$; or mechanically blocking a portion of the GCIB with a variable beam block, adjustable shutter, or variable aperture. The modulating variations may be continuous analog variations or may be time modulated switching or gating.

The processing chamber 108 may further include an in-situ metrology system. For example, the in-situ metrology system may include an optical diagnostic system having an optical transmitter 280 and optical receiver 282 configured to illuminate substrate 252 with an incident optical signal 284 and to receive a scattered optical signal 288 from substrate 252, respectively. The optical diagnostic system comprises optical windows to permit the passage of the incident optical signal 284 and the scattered optical signal 288 into and out of the processing chamber 108. Furthermore, the optical transmitter 280 and the optical receiver 282 may comprise transmitting and receiving optics, respectively. The optical transmitter 280 receives, and is responsive to, controlling electrical signals from the control system 190. The optical receiver 282 returns measurement signals to the control system 190.

The in-situ metrology system may comprise any instrument configured to monitor the progress of the GCIB processing. According to one embodiment, the in-situ metrology system may constitute an optical scatterometry system. The scatterometry system may include a scatterometer, incorporating beam profile ellipsometry (ellipsometer) and beam profile reflectometry (reflectometer), commercially available from Therma-Wave, Inc. (1250 Reliance Way, Fremont, Calif. 94539) or Nanometrics, Inc. (1550 Buckeye Drive, Milpitas, Calif. 95035).

For instance, the in-situ metrology system may include an integrated Optical Digital Profilometry (iODP) scatterometry module configured to measure process performance data resulting from the execution of a treatment process in the GCIB processing system 100'. The metrology system may, for example, measure or monitor metrology data resulting from the treatment process. The metrology data can, for example, be utilized to determine process performance data that characterizes the treatment process, such as a process rate, a relative process rate, a feature profile angle, a critical dimension, a feature thickness or depth, a feature shape, etc. For example, in a process for directionally depositing material on a substrate, process performance data can include a critical dimension (CD), such as a top, middle or bottom CD in a feature (i.e., via, line, etc.), a feature depth, a material thickness, a sidewall angle, a sidewall shape, a deposition rate, a relative deposition rate, a spatial distribution of any parameter thereof, a parameter to characterize the uniformity of any spatial distribution thereof, etc. Operating the X-Y positioning table 253 via control signals from control system 190, the in-situ metrology system can map one or more characteristics of the substrate 252.

Figure 9:
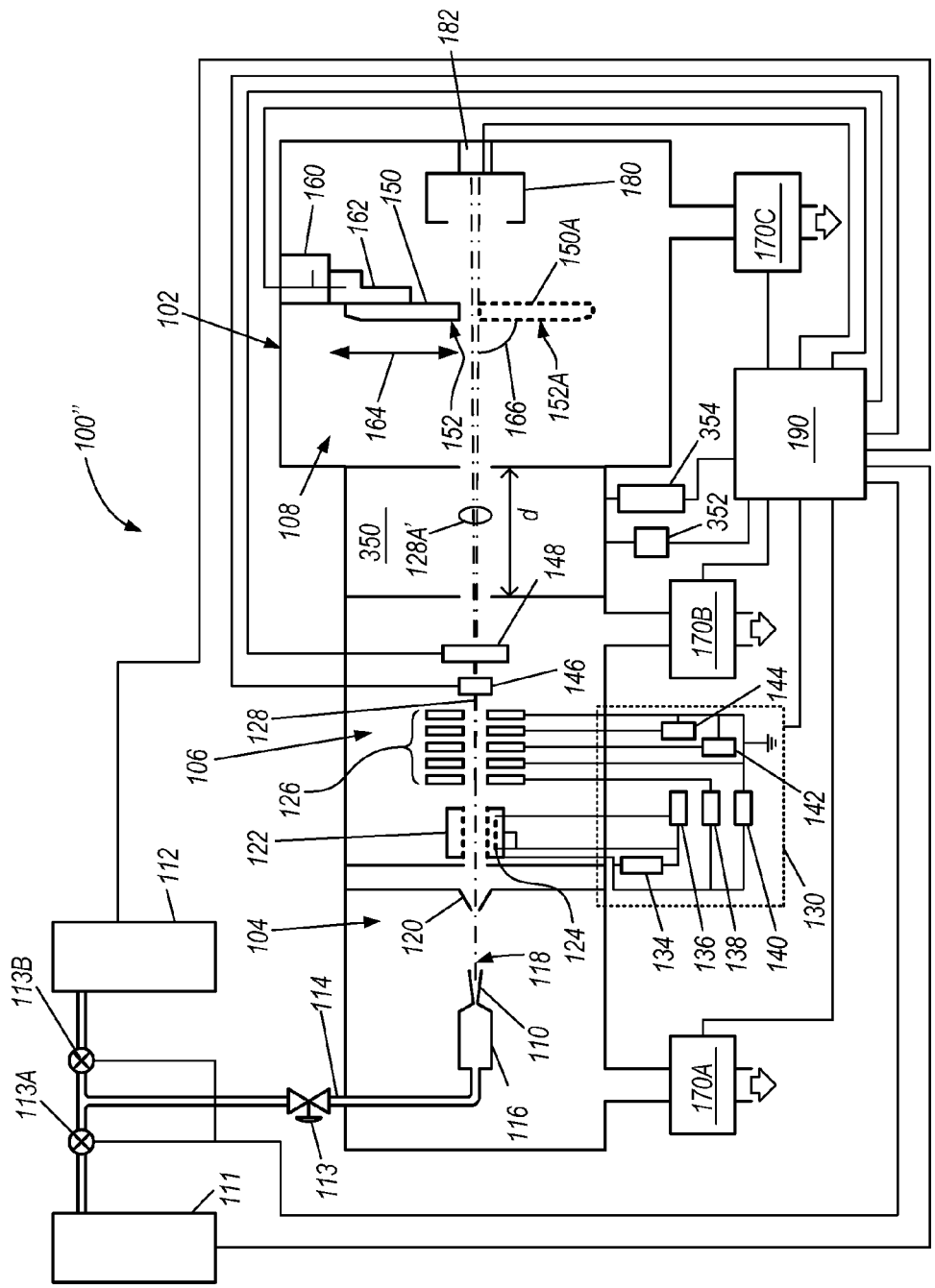
FIG. 9 is yet another schematic illustration of a GCIB processing system.

In the embodiment shown in FIG. 9, the GCIB processing system 100" can be similar to the embodiment of FIG. 7 and further comprise a pressure cell chamber 350 positioned, for example, at or near an outlet region of the ionization/acceleration chamber 106. The pressure cell chamber 350 comprises an inert gas source 352 configured to supply a background gas to the pressure cell chamber 350 for elevating the pressure in the pressure cell chamber 350, and a pressure sensor 354 configured to measure the elevated pressure in the pressure cell chamber 350.

The pressure cell chamber 350 may be configured to modify the beam energy distribution of GCIB 128 to produce a modified processing GCIB 128A'. This modification of the beam energy distribution is achieved by directing GCIB 128 along a GCIB path through an increased pressure region within the pressure cell chamber 350 such that at least a portion of the GCIB traverses the increased pressure region. The extent of modification to the beam energy distribution may be characterized by a pressure-distance integral along that portion of the GCIB path, where distance (or length of the pressure cell chamber 350) is indicated by path length (d). When the value of the pressure-distance integral is increased (either by increasing the pressure and/or the path length (d)), the beam energy distribution is broadened and the peak energy is decreased. When the value of the pressure-distance integral is decreased (either by decreasing the pressure and/or the path length (d)), the beam energy distribution is narrowed and the peak energy is increased. Further details for the design of a pressure cell may be determined from U.S. Pat. No. 7,060,989, entitled METHOD AND APPARATUS FOR IMPROVED PROCESSING WITH A GAS-CLUSTER ION BEAM; the content of which is incorporated herein by reference in its entirety.

Control system 190 comprises a microprocessor, memory, and a digital I/O port capable of generating control voltages sufficient to communicate and activate inputs to GCIB processing system 100 (or 100', 100"), as well as monitor outputs from GCIB processing system 100 (or 100', 100"). Moreover, control system 190 can be coupled to and can exchange information with vacuum pumping systems 170A, 170B, and 170C, first gas source 111, second gas source 112, first gas control valve 113A, second gas control valve 113B, beam electronics 130, beam filter 146, beam gate 148, the X-scan actuator 160, the Y-scan actuator 162, and beam current sensor 180. For example, a program stored in the memory can be utilized to activate the inputs to the aforementioned components of GCIB processing system 100 according to a process recipe in order to perform a GCIB process on substrate 152.

However, the control system 190 may be implemented as a general purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The control system 190 can be used to configure any number of processing elements, as described above, and the control system 190 can collect, provide, process, store, and display data from processing elements. The control system 190 can include a number of applications, as well as a number of controllers, for controlling one or more of the processing elements. For example, control system 190 can include a graphic user interface (GUI) component (not shown) that can provide interfaces that enable a user to monitor and/or control one or more processing elements.

Control system 190 can be locally located relative to the GCIB processing system 100 (or 100', 100"), or it can be remotely located relative to the GCIB processing system 100 (or 100', 100"). For example, control system 190 can exchange data with GCIB processing system 100 using a direct connection, an intranet, and/or the internet. Control system 190 can be coupled to an intranet at, for example, a customer site (i.e., a device maker, etc.), or it can be coupled to an intranet at, for example, a vendor site (i.e., an equipment manufacturer). Alternatively or additionally, control system 190 can be coupled to the internet. Furthermore, another computer (i.e., controller, server, etc.) can access control system 190 to exchange data via a direct connection, an intranet, and/or the internet.

Substrate 152 (or 252) can be affixed to the substrate holder 150 (or substrate holder 250) via a clamping system (not shown), such as a mechanical clamping system or an electrical clamping system (e.g., an electrostatic clamping system). Furthermore, substrate holder 150 (or 250) can include a heating system (not shown) or a cooling system (not shown) that is configured to adjust and/or control the temperature of substrate holder 150 (or 250) and substrate 152 (or 252).

Vacuum pumping systems 170A, 170B, and 170C can include turbo-molecular vacuum pumps (TMP) capable of pumping speeds up to about 5000 liters per second (and greater) and a gate valve for throttling the chamber pressure. In conventional vacuum processing devices, a 1000 to 3000 liter per second TMP can be employed. TMPs are useful for low pressure processing, typically less than about 50 mTorr. Although not shown, it may be understood that pressure cell chamber 350 may also include a vacuum pumping system. Furthermore, a device for monitoring chamber pressure (not shown) can be coupled to the vacuum vessel 102 or any of the three vacuum chambers 104, 106, 108. The pressure-measuring device can be, for example, a capacitance manometer or ionization gauge.

Figure 10:
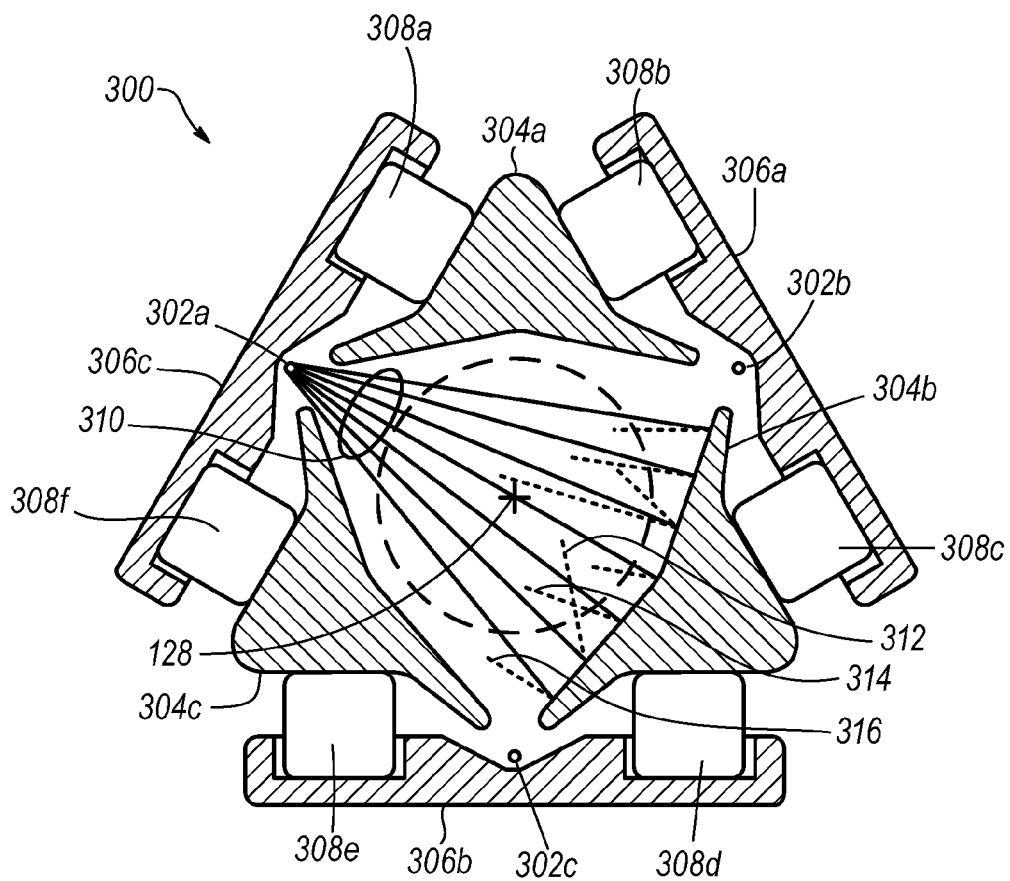
FIG. 10 is a cross-sectional schematic illustration of an ionization source for a GCIB processing system.

Referring now to FIG. 10, a section 300 of a gas cluster ionizer (122, FIGS. 7, 8 and 9) for ionizing a gas cluster jet (gas cluster beam 118, FIGS. 7, 8 and 9) is shown. The section 300 is normal to the axis of GCIB 128. For typical gas cluster sizes (2000 to 15000 atoms), clusters leaving the skimmer aperture (120, FIGS. 7, 8 and 9) and entering an ionizer (122, FIGS. 7, 8 and 9) will travel with a kinetic energy of about 130 to 1000 electron volts (eV). At these low energies, any departure from space charge neutrality within the ionizer 122 will result in a rapid dispersion of the jet with a significant loss of beam current. FIG. 10 illustrates a self-neutralizing ionizer. As with other ionizers, gas clusters are ionized by electron impact. In this design, thermo-electrons (seven examples indicated by 310) are emitted from multiple linear thermionic filaments 302a, 302b, and 302c (typically tungsten) and are extracted and focused by the action of suitable electric fields provided by electron-repeller electrodes 306a, 306b, and 306c and beam-forming electrodes 304a, 304b, and 304c. Thermo-electrons 310 pass through the gas cluster jet and the jet axis and then strike the opposite beam-forming electrode 304b to produce low energy secondary electrons (312, 314, and 316 indicated for examples).

Though (for simplicity) not shown, linear thermionic filaments 302b and 302c also produce thermo-electrons that subsequently produce low energy secondary electrons. All the secondary electrons help ensure that the ionized cluster jet remains space charge neutral by providing low energy electrons that can be attracted into the positively ionized gas cluster jet as required to maintain space charge neutrality. Beam-forming electrodes 304a, 304b, and 304c are biased positively with respect to linear thermionic filaments 302a, 302b, and 302c and electron-repeller electrodes 306a, 306b, and 306c are negatively biased with respect to linear thermionic filaments 302a, 302b, and 302c. Insulators 308a, 308b, 308c, 308d, 308e, and 308f electrically insulate and support electrodes 304a, 304b, 304c, 306a, 306b, and 306c. For example, this self-neutralizing ionizer is effective and achieves over 1000 micro Amps argon GCIBs.

Alternatively, ionizers may use electron extraction from plasma to ionize clusters. The geometry of these ionizers is quite different from the three filament ionizer described here but the principles of operation and the ionizer control are very similar. For example, the ionizer design may be similar to the ionizer described in U.S. Pat. No. 7,173,252, entitled IONIZER AND METHOD FOR GAS-CLUSTER ION-BEAM FORMATION; the content of which is incorporated herein by reference in its entirety.

The gas cluster ionizer (122, FIGS. 7, 8 and 9) may be configured to modify the beam energy distribution of GCIB 128 by altering the charge state of the GCIB 128. For example, the charge state may be modified by adjusting an electron flux, an electron energy, or an electron energy distribution for electrons utilized in electron collision-induced ionization of gas clusters.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

What is claimed is:

1. A method for treating a structure, comprising:
   forming said structure on a substrate, said structure having a plurality of surfaces including one or more first surfaces lying substantially parallel to a first plane parallel with said substrate, and one or more second surfaces lying substantially perpendicular to said first plane;
   growing and/or depositing a screening layer on at least a portion of said one or more first surfaces;
   thereafter, directing a gas cluster ion beam (GCIB) formed from a material source toward said substrate with a controlled directionality to place at least said one or more second surfaces in a path of said GCIB, wherein said directionality is controlled by orienting said substrate relative to a direction of incidence of said GCIB and/or adjusting a beam divergence of said GCIB; and
   treating at least said one or more second surfaces with said GCIB, wherein said screening layer is at least partially in said path of said GCIB and has a thickness greater than a penetration depth of said GCIB whereby treatment by said GCIB is avoided in said at least a portion of said one or more first surfaces underlying said screening layer.

2. The method of claim 1, wherein said structure comprises a via, a contact, a trench, a film stack, a fin, a multi-gate field-effect transistor (MuFET), or a fin field-effect transistor (FinFET).

3. The method of claim 1, wherein said treating at least said one or more second surfaces comprises doping said one or more second surfaces, etching said one or more second surfaces, cleaning said one or more second surfaces, depositing a thin film on said one or more second surfaces, growing a thin film on said one or more second surfaces, modifying a property of said one or more second surfaces, or smoothing said one or more second surfaces, or any combination of two or more thereof.

4. The method of claim 1, wherein said material source comprises one or more elements selected from the group consisting of B, C, Si, Ge, N, P, As, O, S, and Cl.

5. The method of claim 1, wherein said material source comprises a dopant and said treating comprises introducing said dopant into said one or more second surfaces to said penetration depth.

6. A method for treating a structure, comprising:
   forming said structure on a substrate, said structure having a plurality of surfaces including one or more first surfaces lying substantially parallel to a first plane parallel with said substrate, and one or more second surfaces lying substantially perpendicular to said first plane;
   forming a gas cluster ion beam (GCIB) from a material source comprising a dopant and selecting a beam energy, a beam energy distribution, a beam focus, and a beam dose to achieve a desired penetration depth of said dopant in said one or more second surfaces;
   accelerating said GCIB to achieve said beam energy;
   focusing said GCIB to achieve said beam focus;
   directing said accelerated GCIB toward at least a portion of said substrate with a direction of incidence and according to said beam dose;
   orienting said substrate relative to said direction of incidence; and
   treating said one or more second surfaces with said GCIB to introduce said dopant to said at least a portion of said substrate to achieve said desired penetration depth.

7. The method of claim 6, further comprising:
   adjusting a first amount of said dopant introduced to said one or more first surfaces and/or a second amount of said dopant introduced to said one or more second surfaces by modifying said beam energy, modifying said beam energy distribution, modifying said beam focus, modifying said beam dose, or adjusting an orientation of said substrate relative to said direction of incidence, or any combination of two or more thereof.

8. A method for preparing a gate structure, comprising:
   forming a fin on a substrate;
   introducing a dopant into a sidewall of said fin using a gas cluster ion beam (GCIB); and
   forming a screening layer on a top surface of said fin prior to said introducing said dopant to said sidewall.

9. The method of claim 8, wherein said introducing said dopant comprises introducing one or more elements selected from the group consisting of B, C, Si, Ge, N, P, As, O, S, and Cl.

10. The method of claim 8, wherein said forming said screening layer comprises using another GCIB to grow and/or deposit said screening layer.

11. The method of claim 8, wherein said forming said screening layer comprises using a thermal oxidation process, a vapor deposition process, a sputter deposition, a physical vapor deposition process, an ionized physical vapor deposition process, a chemical vapor deposition process, or a plasma-enhanced chemical vapor deposition process.

12. The method of claim 8, wherein said forming said screening layer comprises growing and/or depositing a layer of silicon oxide ($SiO_x$), silicon nitride ($SiN_y$), silicon oxynitride ($SiO_xN_y$), silicon-germanium (SiGe), or germanium (Ge).

13. The method of 8, further comprising:
selecting a beam energy, a beam energy distribution, a beam focus, and a beam dose to achieve a desired penetration depth of said dopant in said sidewall of said fin;
accelerating said GCIB to achieve said beam energy;
focusing said GCIB to achieve said beam focus;
irradiating at least a portion of said substrate with said accelerated GCIB according to said beam dose; and
introducing said dopant in said sidewall of said fin to achieve said desired penetration depth.

14. The method of claim 13, further comprising:
adjusting a first amount of said dopant in said screening layer and/or a second amount of said dopant in said sidewall by modifying said beam energy, modifying said beam energy distribution, modifying said beam focus, modifying said beam dose, or adjusting an orientation of said substrate relative to a direction of incidence of said GCIB, or any combination of two or more thereof.

15. The method of claim 13, further comprising:
adjusting a first amount of said dopant in said screening layer, or a second amount of said dopant in said sidewall, or any combination of two or more thereof, by adjusting a beam divergence of said GCIB.

16. The method of claim 8, wherein said fin is adapted for use as a source or drain for a multi-gate field-effect transistor (MuFET), or a fin field-effect transistor (FinFET).

17. A method for preparing a gate structure, comprising:
forming a fin on a substrate;
forming a screening layer on a top surface of said fin using a gas cluster ion beam (GCIB); and
introducing a dopant into a sidewall of said fin following said forming said screening layer.

18. The method of claim 17, wherein said introducing said dopant into said sidewall comprises performing an ion implantation process or a plasma immersion ion implantation process.

19. The method of claim 17, wherein said introducing said dopant comprises introducing one or more elements selected from the group consisting of B, C, Si, Ge, N, P, As, O, S, and Cl.

* * * * *